(12) United States Patent
Aramaki et al.

(10) Patent No.: US 8,828,264 B2
(45) Date of Patent: Sep. 9, 2014

(54) MAGNETIC SHEET

(75) Inventors: Keisuke Aramaki, Tochigi (JP); Yukio Tamate, Tochigi (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 140 days.

(21) Appl. No.: 12/768,853

(22) Filed: Apr. 28, 2010

(65) Prior Publication Data

US 2010/0264357 A1    Oct. 21, 2010

Related U.S. Application Data

(63) Continuation of application No. PCT/JP2008/068748, filed on Oct. 16, 2008.

(30) Foreign Application Priority Data

Oct. 29, 2007  (JP) ................................ 2007-280525
Jan. 28, 2008  (JP) ................................ 2008-016288

(51) Int. Cl.
| | | |
|---|---|---|
| *H05K 9/00* | (2006.01) | |
| *H01Q 17/00* | (2006.01) | |
| *C08K 3/32* | (2006.01) | |
| *C08L 63/00* | (2006.01) | |
| *H01Q 1/24* | (2006.01) | |
| *C08K 5/3492* | (2006.01) | |
| *C08K 5/54* | (2006.01) | |
| *C08K 5/20* | (2006.01) | |
| *C08K 3/02* | (2006.01) | |

(52) U.S. Cl.
CPC ............. *H01Q 17/004* (2013.01); *H01Q 17/00* (2013.01); *H05K 9/0083* (2013.01); *C08K 3/32* (2013.01); *H01Q 17/007* (2013.01); *C08L 63/00* (2013.01); *H01Q 1/245* (2013.01); *C08K 5/54* (2013.01); *C08K 5/34928* (2013.01); *C08K 5/20* (2013.01); *C08K 3/02* (2013.01)
USPC .................................................... 252/62.54

(58) Field of Classification Search
USPC ...................................................... 252/62.54
See application file for complete search history.

(56) References Cited

U.S. PATENT DOCUMENTS

| | | | | |
|---|---|---|---|---|
| 4,315,897 | A | * | 2/1982 | Staendeke et al. ............. 423/274 |
| 4,698,215 | A | * | 10/1987 | Albanesi et al. .............. 423/274 |
| 6,043,304 | A | | 3/2000 | Kehal |
| 6,444,315 | B1 | * | 9/2002 | Barfurth et al. ............... 428/403 |
| 2010/0012881 | A1 | | 1/2010 | Aramake |

FOREIGN PATENT DOCUMENTS

| | | | |
|---|---|---|---|
| CN | 1201477 | A | 12/1998 |
| JP | 2003-243879 | * | 8/2003 |
| JP | 2003-243879 | A | 8/2003 |
| JP | 2003-324299 | A | 11/2003 |
| JP | 2004-71993 | A | 3/2004 |
| JP | 2005-159337 | A | 5/2005 |
| JP | 2005-159337 | * | 6/2005 |
| JP | 2006-73949 | A | 3/2006 |
| JP | 2007-186622 | A | 7/2007 |
| TW | 200812471 | A | 3/2008 |
| WO | 2007/007834 | A1 | 1/2007 |
| WO | WO 2007/013436 | A1 | 2/2007 |

OTHER PUBLICATIONS

Material Data sheet for Stabiace MC-5S, no date.*
Translation for JP 2005-159337, Jun. 2005.*
Translation for JP 2003-243879, Aug. 2003.*
International Search Report for PCT/JP2008/068748 completed Dec. 5, 2008.
English translation of International Search Report and International Preliminary Report on Patentability issued Dec. 16, 2008 in PCT/JP2008/068748.
English translation of Japanese Office Action issued Jan. 18, 2011 in corresponding Japanese Patent Application No. 2008-261355.
Office Action from Chinese Patent Office issued in corresponding Chinese Patent Application No. 2008801126743 dated Nov. 2, 2011, with a partial English translation.
English translation of an Office Action issued on Nov. 20, 2012, in corresponding Taiwan Patent Application No. 097141053.

* cited by examiner

*Primary Examiner* — Carol M Koslow
(74) *Attorney, Agent, or Firm* — Buchanan Ingersoll & Rooney PC

(57) ABSTRACT

A magnetic sheet containing a binder, a magnetic powder, and a fire retardant, wherein the fire retardant contains at least one of a silicon atom-containing melamine cyanurate and a carboxylic acid amide-containing melamine cyanurate.

11 Claims, 16 Drawing Sheets

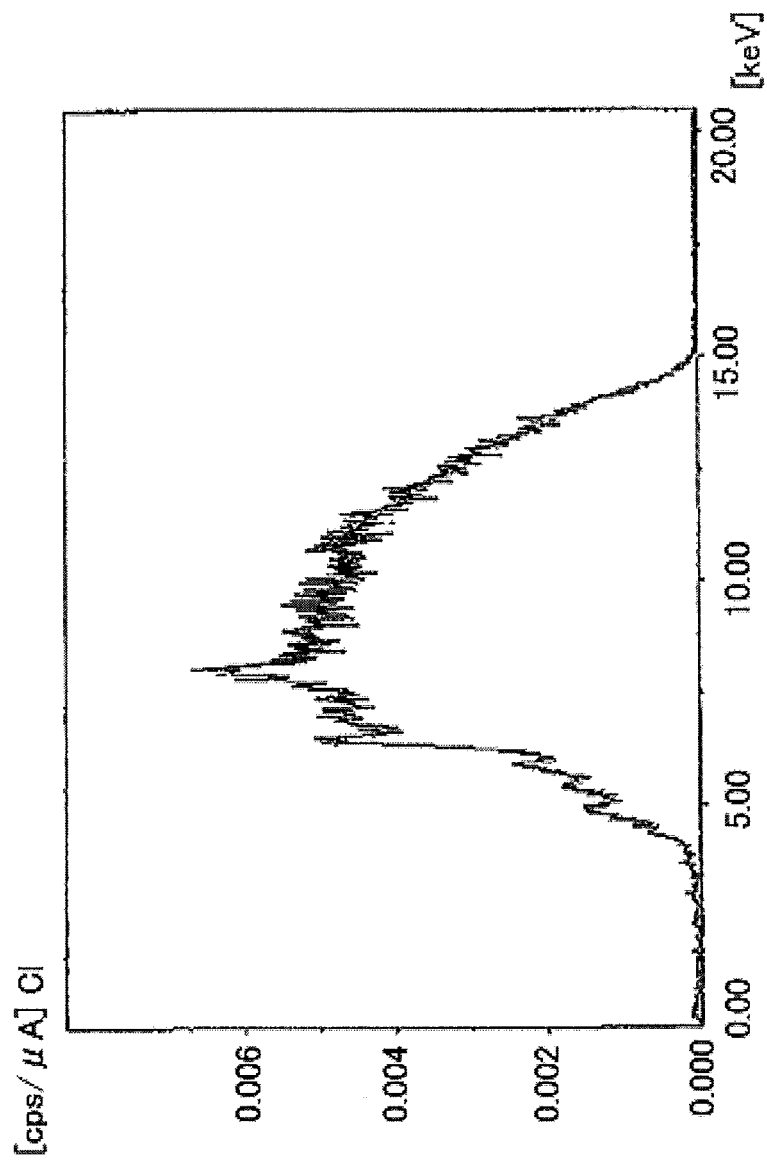

MAGNETIC SHEET

CROSS-REFERENCE TO RELATED APPLICATION

This is a continuation of Application No. PCT/JP2008/068748, filed on Oct. 16, 2008.

BACKGROUND OF THE INVENTION

1. Field of the Invention

The present invention relates to a magnetic sheet, which is capable of suppressing undesirable electromagnetic waves emitted from an electronic equipment, and inhibiting electromagnetic disorders occurred in an electronic equipment.

2. Description of the Related Art

The magnetic sheets are used for depression of noise, or for RFID. For the purpose of depression of noise, along with rapid developments of electronic equipments, e.g. personal computers and mobile phones, such as down sizing and higher frequency, these electronic equipments suffer from a noise interference due to outer electromagnetic waves and interference of noises occurred within the electronic equipment. In order to suppress such interferences, various countermeasures have been taken for the noises. For example, a magnetic sheet (noise depressing sheet) is disposed adjacent to a noise emitting source or a noise receiving source.

The magnetic sheet is formed by adding alloy (magnetic powder) such as Fe—Si—Al to an epoxy resin, acrylic resin, or the like, and then being cured to form into a sheet by hot pressing. The magnetic powder inhibits noise, and functions as a so-called noise depressor. The better the effect of inhibiting the noise of the magnetic sheet is, the larger an imaginary part $\mu''$ of the magnetic permeability of the magnetic sheet is.

On the other hand, in the case where the magnetic sheets are used for RFID, as a recent trend in the art, radio communication using a coil antenna in an electromagnetic induction method, which is represented as mobile information terminals having IC tags referred as Radio Frequency Identification (RFID), has been widely used. For example, in the mobile information terminal, various conductors (metals) such as a metal casing or metal parts are disposed adjacent to an antenna element for transmitting and receiving due to downsizing of the mobile information terminal. In this case, a magnetic field usable for the transmission is largely attenuated because of the metal present adjacent to the antenna element, and as a result, a communication distance for RFID transmission in an electromagnetic induction system may be shortened, or transmission or receiving of a radio frequency may become difficult because a resonance frequency is shifted. To prevent these electromagnetic disorders, a magnetic sheet is placed between the antenna element and the conductor. As for a function of RFID, it is preferred that the magnetic sheet has a large real part $\mu'$ of the magnetic permeability, and a small imaginary part $\mu''$ of the magnetic permeability.

As the magnetic sheets are mounted in electronic equipments or the like, the magnetic sheets are required to have heat resistance and fire retardance. Therefore, a fire retardant is generally contained in the magnetic sheets.

However, as a conventional fire retardant, a halogen-based compound typified by a bromine-based fire retardant is used. The halogen-based compound has a large environmental load, as it generates a harmful material such as environmental hormone upon burning. Thus, the use of the halogen-based compound tends to be restrained. On the other hand, a phosphorous-based fire retardant has also been used as the fire retardant, but it is inferior to the halogen-based fire retardant in terms of the properties as the fire retardant.

In current situation, there are clients who desire a magnetic sheet having flexibility, and clients who desire a magnetic sheet having a certain hardness or harder to improve workability.

As halogen-free magnetic sheets each containing a fire retardant, the following magnetic sheets are known in the art: magnetic sheets containing aluminum hydroxide, magnesium hydroxide, melamine, or the like as a fire retardant, and red phosphorus, ammonium polyphosphate, or the like as a flame-retardant auxiliary (see Japanese Patent Application Laid-Open (JP-A) No. 2003-324299); magnetic sheets containing as a fire retardant and/or flame-retardant auxiliary, melamine, melamine derivatives, red phosphorus, ammonium polyphosphate, pentaerythritol, dextrin, polyvinyl acetate, or the like (see JP-A No. 2003-243879); and magnetic sheets containing as a fire retardant, aluminum hydroxide or magnesium hydroxide together with red phosphorus (see JP-A No. 2004-71993).

However, these fire retardants and/or flame-retardant auxiliaries do not have sufficient fire retardance, and when they are added in a large amount for obtaining high fire retardance, the magnetic permeability of the magnetic sheet is decreased. Particularly, in the case where a halogen-free fire retardant is used, generally if a large amount of the fire retardant is not added, the fire retardance cannot be sufficiently exhibited. However, when the large amount of the fire retardant is added to give the fire retardance to the magnetic sheet, the magnetic sheet may be hardened. Thus, in order to obtain a soft magnetic sheet, the amount of the fire retardant needs to be decreased as small as possible, at the same time as obtaining sufficient fire retardance.

Moreover, the magnetic sheet has poor humidity resistance, and the fire retardant bleeds on a surface of the magnetic sheet, or the magnetic sheet varies in its thickness and magnetic properties by absorbing water. The magnetic sheet is required to have higher reliability for use in the electronic equipments, such as mobile phones, personal computers, and the like.

In the case where a soft magnetic sheet is produced, a large amount of magnetic powder is added to obtain high magnetic permeability, but causing to form a hard magnetic sheet.

BRIEF SUMMARY OF THE INVENTION

The present invention aims at solving the problems in the art, and achieving the following objects. Namely, an object of the present invention is to provide a magnetic sheet which is capable of reducing unnecessary electromagnetic wave released from an electronic equipment, is capable of inhibiting electromagnetic disorders caused by an interference of unnecessary electromagnetic waves within an electronic equipment, has a less environmental load, and satisfies both high fire retardance and magnetic permeability, and prevents the magnetic powder contained therein from falling off from the magnetic sheet.

The inventors of the present invention have intensively studied to solve the problems, and come to the following insights. Namely, the inventors have found that by the use of at least one of a silicon atom-containing melamine cyanurate and a carboxylic acid amide-containing melamine cyanurate as a fire retardant in a magnetic sheet containing a binder, a magnetic powder, and the fire retardant, the magnetic sheet containing no halogen, and having a less environmental load and high fire retardance, from which the magnetic powder is prevented from falling off, can be obtained. The inventors of the present invention have also found that as the fire retardant, red phosphorus is further contained, and the compounding ratio of the red phosphorus, the silicon atom-containing melamine cyanurate, and carboxylic acid amide-containing melamine cyanurate are adjusted so as to satisfy both providing high fire retardance and preventing the magnetic powder from falling off.

The invention is based on the aforementioned findings and the means for solving the aforementioned problems are as follows.

<1> A magnetic sheet containing: a binder; a magnetic powder; and a fire retardant, wherein the fire retardant contains at least one of a silicon atom-containing melamine cyanurate and a carboxylic acid amide-containing melamine cyanurate.

Since the magnetic sheet described in <1> contains no halogen, an environmental load is small. The fire retardant contains at least one of the silicon atom-containing melamine cyanurate and the carboxylic acid amide-containing melamine cyanurate, so as to satisfy both high fire retardance and magnetic permeability. Furthermore, the magnetic powder is prevented from falling off from the magnetic sheet can be prevented.

<2> The magnetic sheet according to <1>, wherein the at least one of the silicon atom-containing melamine cyanurate and the carboxylic acid amide-containing melamine cyanurate has a number average particle size of 1 μm or less.

The magnetic sheet described in <2>, the number average particle size of the melamine cyanurate is as small as 1 μm or less, so that close alignment of the magnetic powder is not blocked. Thus, the magnetic sheet described in <2> can obtain higher magnetic permeability the magnetic sheet containing the fire retardant having a large particle size.

<3> The magnetic sheet according to any one of <1> and <2>, wherein the magnetic sheet contains 400 parts by mass to 1,550 parts by mass of the magnetic powder, and 70 parts by mass to 150 parts by mass of at least one of the silicon atom-containing melamine cyanurate and the carboxylic acid amide-containing melamine cyanurate, relative to 100 parts by mass of the binder, and wherein the mass of the magnetic powder in the magnetic sheet is 60% by mass to 90% by mass.

<4> The magnetic sheet according to any one of <1> to <3>, wherein the fire retardant further contains red phosphorus.

<5> The magnetic sheet according to <4>, wherein the amount of the red phosphorus is 6 parts by mass to 19 parts by mass, relative to 100 parts by mass of the binder.

<6> The magnetic sheet according to any one of <1> to <5>, further containing a curing agent.

The magnetic sheet described in <6>, further contains the curing agent, so that thickness variation of the magnetic sheet in a high temperature and high humidity environment can be decreased.

<7> The magnetic sheet according to <6>, wherein the binder contains an epoxy resin.

In the magnetic sheet described in <7>, the binder contains an epoxy resin, so that thickness variation of the magnetic sheet in a high temperature and high humidity environment can be decreased.

<8> The magnetic sheet according to any one of <1> to <5>, wherein the binder contains an ethylene-vinyl acetate copolymer.

In the magnetic sheet described in <8>, the binder contains an ethylene-vinyl acetate copolymer, so that the magnetic sheet can have flexibility.

<9> The magnetic sheet according to any one of <1> to <8>, wherein the magnetic sheet is used for a RFID functioned electronic equipment.

<10> The magnetic sheet according to any one of <1> to <8>, wherein the magnetic sheet is used as a noise depressor.

According to the present invention, the various problems in the conventional art can be solved, and a magnetic sheet, which is capable of reducing unnecessary electromagnetic wave released from an electronic equipment, is capable of inhibiting electromagnetic disorders caused by an interference of unnecessary electromagnetic waves within an electronic equipment, has a less environmental load, and satisfies both high fire retardance and magnetic permeability, and from which the magnetic powder is prevented from falling off, can be provided. The magnetic sheet of the present invention can be used in the KHz to GHz range.

BRIEF DESCRIPTION OF THE DRAWINGS

FIGS. 1G to 1I are graphs showing XRF measurement data of non-surface treated melamine cyanurate (MC-40N) for comparison with FIGS. 1A to 1C.

Figure 1A:
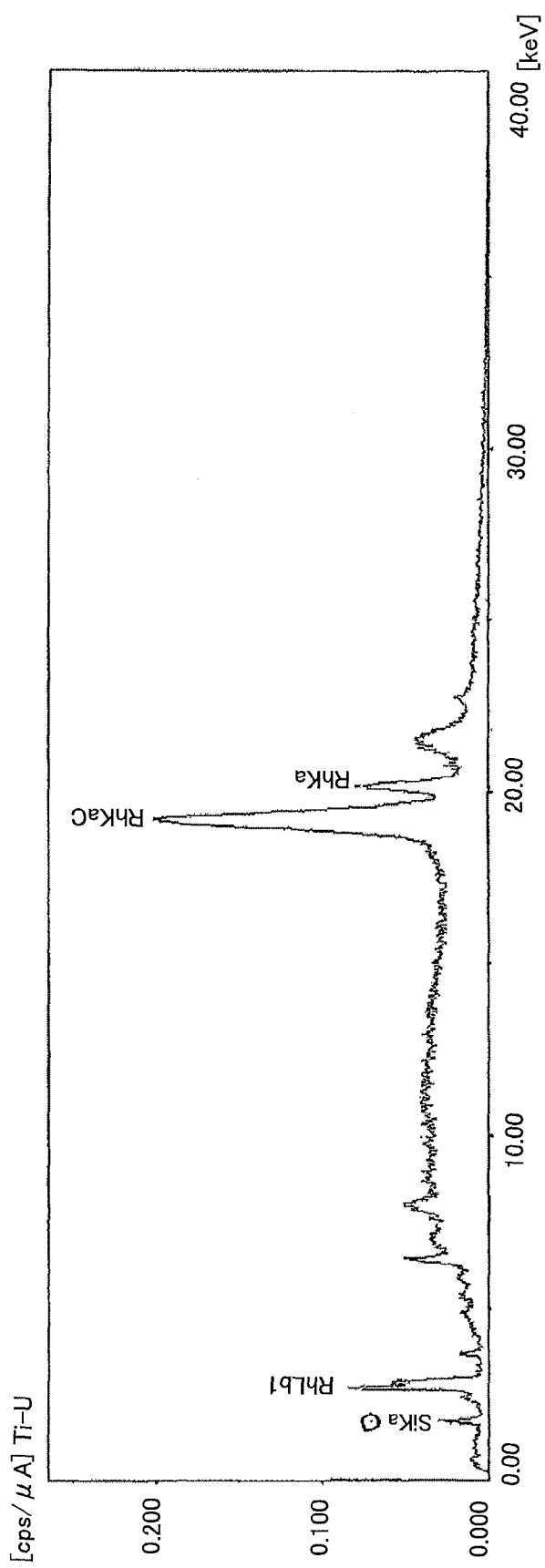
FIGS. 1A to 1C are graphs showing XRF measurement data of a fire retardant (MC-5S) used in Example 1.

DETAILED DESCRIPTION OF THE INVENTION (Magnetic Sheet)

The magnetic sheet of the present invention contains at least a binder, a magnetic powder, and a fire retardant, and further contains appropriately selected other components as necessary.

—Fire Retardant—

The fire retardant is added so as to improve a fire retardance of the magnetic sheet.

The magnetic sheet of the present invention contains at least one of a silicon atom-containing melamine cyanurate and a carboxylic acid amide-containing melamine cyanurate as the fire retardant.

As the conventional fire retardant, a halogen-based compound is mainly used. When the halogen-based compound is burned, a harmful material is generated, causing a large environmental load. Moreover, as the halogen-free fire retardant, for example, non-surface treated melamine cyanurate is known. But, the non-surface treated melamine cyanurate has poor compatibility with a binder and is hard to be dispersed in the binder. Thus, in the case where a hard magnetic sheet is intended to be produced, the mechanical strength of the magnetic sheet immediately after forming (pressing) is decreased, i.e. the magnetic sheet is softened. Moreover, as the mechanical strength significantly decreases, it is difficult to increase the amount of the melamine cyanurate to be added, and thus sufficient fire retardance cannot be obtained. Furthermore, from the surface of the magnetic sheet, magnetic powder easily falls off, i.e. so-called powder falling easily occurs.

Here, the melamine cyanurate is a melamine-isocyanuric acid adduct, which is formed as an oligomer adduct by repeating an addition reaction of melamine and isocyanurate, as shown in the following reaction formula.

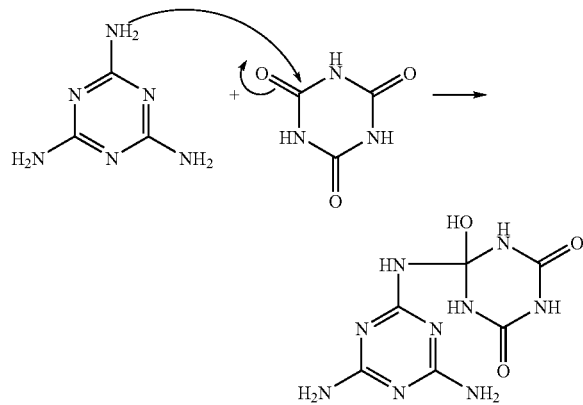 [SMILES: Nc1nc(N)nc(N)n1 ; O=c1[nH]c(=O)[nH]c(=O)[nH]1 ; Nc1nc(N)nc(NC2(O)NC(=O)NC(=O)N2)n1]

The melamine cyanurate has stiffness due to melamine skeleton, and a hydroxyl group (OH) is generated therein by the addition reaction. Thus, the melamine cyanurate has a polarity due to the hydroxyl group, so that fire retardance is exhibited. However, it is extrapolated and confirmed that the hydroxyl groups form hydrogen bonds between molecules in many occasions, and that the hydrogen bonds formed by the hydroxyl groups may cause aggregation of isocyanurates. Therefore, it is considered that the hydrogen bonds are blocked, namely, melamine cyanurate in which part of hydrogen bonds is protected is used, so as to inhibit occurrence of aggregation and to improve dispersibility in the binder.

Thus, it has been found that as the fire retardant, by the use of at least one of the silicon atom-containing melamine cyanurate (melamine cyanurate whose surface treated with a silicon compound) and the carboxylic acid amide-containing melamine cyanurate (melamine cyanurate whose surface treated with fatty acid), it exhibits higher fire retardance than that of the non-surface treated melamine cyanurate, that powder-falling of the magnetic powder from the surface of the magnetic sheet is hard to occur, and that when as the binder, for example, an acrylic rubber described below is used, curing of the binder is accelerated upon pressing, to thereby obtain a magnetic sheet having excellent surface smoothness, in which thickness variation is suppressed in a high temperature and high humidity environment.

—Silicon Atom-Containing Melamine Cyanurate—

The presence of the silicon atom in the silicon atom-containing melamine cyanurate can be confirmed, for example, by X-ray fluorescence analysis (XRF).

The number average particle size of the silicon atom-containing melamine cyanurate is suitably selected depending on the intended purpose without any restriction. It is preferably 1 μm or less.

When the number average particle size is greater than 1 μm, the silicon atom-containing melamine cyanurate blocks close alignment of the magnetic powder, and the magnetic properties of the magnetic sheet may be degraded, and the thickness variation of the magnetic sheet may become large at high temperature or in a high temperature and high humidity environment.

The number average particle size of the magnetic powder can be obtained, for example, from a particle size distribution thereof measured by laser diffraction.

The silicon atom-containing melamine cyanurate may be a commercially available product or arbitrarily prepared product.

Examples of the commercially available product include MC-5S (manufactured by SAKAI CHEMICAL INDUSTRY, CO., LTD.).

A method for producing the silicon atom-containing melamine cyanurate is suitably selected depending on the intended purpose without any restriction. For example, a method for treating a surface of the melamine cyanurate using a silicon compound is preferably used.

As a surface treatment method is suitably selected from known methods depending on the intended purpose without any restriction. For example, a method of mixing and stirring the melamine cyanurate and the silicon compound is used.

The silicon compound is suitably selected depending on the intended purpose without any restriction. Examples thereof include organopolysiloxane such as methyl hydrogen polysiloxane, dimethyl polysiloxane, and methyl phenyl polysiloxane; silane compounds containing silane coupling agents, such as methyltrimethoxysilane, ethyl trimethoxysilane, hexyl trimethoxysilane, octyl trimethoxysilane, decyl trimethoxysilane, octadecyl trimethoxysilane, dimethyl dimethoxysilane, octyl triethoxysilane, trifluoromethylethyl trimethoxysilane, heptadecafluorodecyl trimethoxysilane, vinyl trimethoxysilane, and γ-aminopropyl trimethoxysilane. These may be used individually or in combination. Of these, alkoxysilanes such as methyltrimethoxysilane, and ethyl trimethoxysilane are preferable, in terms of excellent reactivity.

—Carboxylic Acid Amide-Containing Melamine Cyanurate—

The presence of the carboxylic acid amide in the carboxylic acid amide-containing melamine cyanurate can be confirmed, for example, by pyrolysis gas chromatography analysis (Py-GC-MS).

The number average particle size of the carboxylic acid amide-containing melamine cyanurate is suitably selected depending on the intended purpose without any restriction. It is preferably 1 μm or less.

When the number average particle size is more than 1 μm, the close alignment of the magnetic powder is blocked, and the magnetic properties of the magnetic sheet may be degraded, and the thickness variation of the magnetic sheet may become large at high temperature or in a high temperature and high humidity environment.

The number average particle size of the carboxylic acid amide-containing melamine cyanurate can be obtained, for example, from a particle size distribution thereof measured by a laser diffraction.

The carboxylic acid amide-containing melamine cyanurate may be a commercially available product or arbitrarily prepared product.

Examples of the commercially available product include MC-5F (manufactured by SAKAI CHEMICAL INDUSTRY, CO., LTD.).

A method for producing the carboxylic acid amide-containing melamine cyanurate is suitably selected depending on the intended purpose without any restriction. For example, a method for treating a surface of the melamine cyanurate using fatty acid is preferably used.

A surface treatment method is suitably selected from known methods depending on the intended purpose without any restriction. For example, a method of mixing and stirring the melamine cyanurate and the fatty acid is used.

When the surface of the melamine cyanurate is treated with the fatty acid, it is considered that an amino group in the melamine cyanurate is reacted with the fatty acid, and as a result, an amide compound is formed, as represented by the following formula (1). Thus, an analysis is performed by pyrolysis gas chromatography (Py-GC-MS), so as to confirm the presence of the carboxylic acid amide.

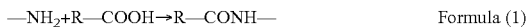

—NH$_2$+R—COOH→R—CONH—   Formula (1)

The fatty acid is suitably selected depending on the intended purpose without any restriction. Examples thereof include lauric acid, isostearic acid, stearic acid, palmitic acid, oleic acid, and linolenic acid. These may be used individually, or in combination. Of these, lauric acid is preferred, in terms of high hydrophobicity and favorable dispersibility.

—Red Phosphorus—

The fire retardant preferably contains red phosphorus, in addition to the silicon atom-containing melamine cyanurate and the carboxylic acid amide-containing melamine cyanurate. This is advantageous in terms of further improving the fire retardance of the magnetic sheet.

The red phosphorus is suitably selected depending on the intended purpose without any restriction, and may be a commercially available product or arbitrarily prepared product. It is preferred that the surface of the red phosphorus be coated for providing excellent humidity resistance, and favorable stability owing to no spontaneous combustion upon mixing.

As the red phosphorus whose surface is coated, red phosphorus whose surface is treated with aluminum hydroxide is exemplified.

The amount of the red phosphorus is suitably selected depending on the intended purpose without any restriction. It is preferably 6 parts by mass to 19 parts by mass, relative to the 100 parts by mass of the binder.

When the amount is less than 6 parts by mass, the effect of improving the fire retardance cannot be obtained. When the amount is more than 19 parts by mass, the total amount of the magnetic powder and the fire retardant increases relative to the binder. This makes difficult to keep binding the magnetic powder and the fire retardant together, with the binder, the proportion of the magnetic powder in the magnetic sheet is decreased, causing decrease in the magnetic permeability.

—Binder—

The binder is suitably selected depending on the intended purpose without any restriction. Examples thereof include an acrylic rubber, an ethylene-vinyl acetate copolymer, polyester, polyester polyurethane, polycarbonate polyurethane, phosphorus-containing polyester, a phosphorus-containing polyester polyurethane. The binders includes various binders such as soft binders and hard binders, and are suitably selected depending on the intended purpose without any restriction. For example, the acrylic rubber is used as the hard binder, and the ethylene-vinyl acetate copolymer is used as the soft binder.

<Acrylic Rubber>

The acrylic rubber preferably contains epoxy groups. In this case, the epoxy groups are reacted with a curing agent, so as to improve reliability. Moreover, the acrylic rubber preferably further contains hydroxyl groups. The hydroxyl groups are contained in the acrylic rubber, so as to improve adhesion.

Examples of the raw material (monomer) of the acrylic rubber include ethyl acrylate (EA), butyl acrylate (BA), and acrylonitrile (AN). The acrylic rubber is a homopolymer or copolymer of these monomers. As the copolymer, an ethyl acrylate-acrylonitrile copolymer (EA/AN), and a butyl acrylate-acrylonitrile copolymer (BA/AN) are preferable.

The mass average molecular mass of the acrylic rubber is 10,000 to 850,000 in terms of excellent coating ability.

When the mass average molecular mass is less than 10,000, the viscosity of the magnetic composition (which prepared by adding the magnetic powder, the fire retardant or the like to the binder) decreases, and it becomes hard to apply the magnetic composition containing the magnetic powder having a large mass. When the mass average molecular mass is more than 850,000, the viscosity of the magnetic composition becomes large, and it becomes hard to apply the magnetic composition having a large viscosity.

The glass transition temperature of the acrylic rubber is preferably −50° C. to +15° C.

When the glass transition temperature is lower than −50° C., the reliability at a high temperature or in a high temperature and high humidity environment may become poor. When the glass transition temperature is higher than +15° C., the magnetic sheet tends to be hard.

The acrylic rubbers having different mass average molecular masses or glass transition temperatures may be combined. Moreover, an acrylic rubber having epoxy groups serving as functional groups, and an acrylic rubber having hydroxyl groups serving as functional groups may be combined. Furthermore, an acrylic rubber having epoxy groups serving and hydroxyl groups serving as functional groups and an acrylic rubber having epoxy groups serving as functional groups may be combined. When these acrylic rubbers are used, high fluidity is obtained and compression properties is increased. Thus, excellent magnetic properties is obtained, and air bubbles are hardly included in the acrylic rubbers, so that reliability of the magnetic sheet is improved.

The binder may contain an epoxy resin as an organic cure component. When an epoxy resin having a small molecular mass is added, the melt viscosity of the binder is further decreased upon compressing (forming) the magnetic sheet. Thus, the magnetic properties can be increased. Moreover, for example, by using a polyfunctional epoxy resin, the reliability of the magnetic sheet after curing can be further improved.

Suitable examples of the epoxy resin include an anionic curing epoxy resin using a microcapsule amine based curing agent, an cationic curing epoxy resin using an onium salt, sulfonium salt, or the like as a curing agent, and a radical curing epoxy resin using an organic peroxide as a curing agent. These may be used individually or in combination.

Further, the binder containing the epoxy resin preferably contains a latent curing agent as the curing agent for the epoxy resin.

The latent curing agent means those exhibiting a function of a curing agent at a certain temperature. Examples thereof include the curing agents of amines, phenols, acid anhydrides, imidazoles, dicyandiamides, and isocyanates.

<Ethylene-Vinyl Acetate Copolymer>

The glass transition temperature of the ethylene-vinyl acetate copolymer is preferably $-100°$ C. to $0°$ C., in terms of flexibility of the magnetic sheet.

When the glass transition temperature is lower than $-100°$ C., the heat resistance may become poor. When the glass transition temperature is higher than $0°$ C., the magnetic sheet tends to become hard.

When the melting point is lower than $200°$ C., the magnetic sheet cannot maintain its shape upon thermal compression.

The amount of the vinyl acetate in the ethylene-vinyl acetate copolymer is preferably 45 mol % to 90 mol %, and more preferably 60 mol % to 80 mol %.

When the amount of the vinyl acetate in the ethylene-vinyl acetate copolymer is not the range of 45 mol % to 90 mol %, this ethylene-vinyl acetate copolymer is inferior in fire retardance and oil resistance to the ethylene-vinyl acetate copolymer containing 45 mol % to 90 mol % of the vinyl acetate.

The ethylene-vinyl acetate copolymer may be a commercially available product, or be an arbitrarily prepared product. Examples of the commercially available product include LEVAPREN (manufactured by Bayer AG), and EVAFLEX (manufactured by Du Pont-Mitsui Polychemicals Co., Ltd.).

As the ethylene-vinyl acetate copolymer itself has a certain degree of fire retardance, when the ethylene-vinyl acetate copolymer is used as the binder, the amount of the fire retardant to be added can be decreased, compared to the case where the acrylic rubber (acrylic resin) is used as the binder.

—Magnetic Powder—

The magnetic powder is suitably selected depending on the intended purpose without any restriction. Examples of the shape of the magnetic powder include a flat, lump, fiber, sphere, and irregular shape. Of these, the flat shape is preferable as the magnetic powder of such shape can be easily orientated in a predetermined direction and high magnetic permeability can be attained.

Examples of the magnetic powder include soft magnetic metal, ferrite, and pure iron particles.

Examples of the soft magnetic metal include magnetic stainless steel (i.e., Fe—Cr—Al—Si alloy), Sendust (i.e., Fe—Si—Al alloy), permalloy (i.e., Fe—Ni alloy), silicon copper (i.e., Fe—Cu—Si alloy), Fe—Si alloy, Fe—Si—B(—Cu—Nb) alloy, Fe—Ni—Cr—Si alloy, Fe—Si—Cr alloy, Fe—Si—Al—Ni—Cr alloy, and amorphous metal.

As the Sendust (i.e., Fe—Si—Al alloy), those having Curie temperature at $480°$ C. to $510°$ C. are preferably used.

Examples of the ferrite include: soft ferrite such as Mn—Zn ferrite, Ni—Zn ferrite, Mn—Mg ferrite, Mn ferrite, Cu—Zn ferrite, and Cu—Mg—Zn ferrite; and hard ferrite that is a permanent magnet material.

The magnetic powder may be used individually, or in combination.

The amount of the binder; the magnetic powder; and at least one of the silicon atom-containing melamine cyanurate and the carboxylic acid amide-containing melamine cyanurate are suitably selected depending on the intended purpose without any restriction. The magnetic powder is preferably 400 parts by mass to 1,550 parts by mass, and at least one of the silicon atom-containing melamine cyanurate and the carboxylic acid amide-containing melamine cyanurate (in the case where the silicon atom-containing melamine cyanurate and the carboxylic acid amide-containing melamine cyanurate are used in combination, the total amount thereof) is preferably 70 parts by mass to 150 parts by mass, relative to 100 parts by mass of the binder.

When the amount of the magnetic powder is less than 400 parts by mass, excellent magnetic properties may not be obtained. When the amount of the magnetic powder is more than 1,550 parts by mass, it becomes hard to bind the magnetic powder with the binder. Consequently, the thickness variation of the magnetic sheet becomes large in a high temperature and high humidity environment, and the fire retardant may bleed on the surface of the magnetic sheet. Moreover, the magnetic sheet becomes brittle, and the magnetic powder falls off (powder falling) not only from an edge face of the magnetic sheet but also from a surface of the magnetic sheet. Furthermore, even when the intention is to obtain a soft magnetic sheet, the magnetic sheet becomes hard, or fire retardance may be decreased because the magnetic powder is metal powder. It is not always the cases that the magnetic permeability may be improved by adding a large amount of the magnetic powder. When the amount of the magnetic powder is too large, many air gaps are formed in the magnetic sheet and magnetic permeability may be decreased. That is, there is an optimum range of the amount of the magnetic powder. The mass of the magnetic powder in the magnetic sheet is preferably 60 mass % to 90 mass %.

When the amount of at least one of the silicon atom-containing melamine cyanurate and the carboxylic acid amide-containing melamine cyanurate is less than 70 parts by mass, the fire retardance may not be sufficiently obtained. When the amount is more than 150 parts by mass, the total amount of the magnetic powder and the fire retardant relative to the binder becomes large, it becomes hard to keep binding the magnetic powder and the fire retardant together, with the binder, and the proportion of the magnetic powder in the magnetic sheet is decreased, causing decrease in the magnetic permeability.

—Other Component—

The other components are suitably selected from various known additives depending on the intended purpose without any restriction, as long as the effect of the present invention is not impaired. For the purpose of improving the coating ability (i.e. adjusting the viscosity) of a magnetic composition, which is prepared by adding the magnetic powder and the fire retardant to the binder, a solvent may be added. Examples of the solvent include: ketenes such as acetone, methyl ethyl ketone, methyl isobutyl ketone, and cyclohexanone; alcohols such as methanol, ethanol, propanol, butanol, isopropyl alcohol; esters such as methyl acetate, ethyl acetate, propyl acetate, butyl acetate, ethyl lactate, and ethyl glycol acetate; ethers such as diethylene glycol dimethyl ether, 2-ethoxy ethanol, tetrahydrofurane, and dioxane; aromatic hydrocarbon compounds such as benzen, toluene, and xylene; and halogenated hydrocarbon compounds such as methylene chloride, ethylene chloride, carbon tetrachloride, chloroform, chlorobenzene. These may be used individually or in combination.

For the purpose of removing the air gaps in the magnetic sheet, a dispersant may be added as the other component. By adding the dispersant, the variation of the size of the magnetic sheet can be decreased. As the dispersant, a fire retardant (dispersing particles) which exhibits excellent dispersibility (for example, MC-5F (manufactured by SAKAI CHEMICAL INDUSTRY, CO., LTD.), and MC-5S (manufactured by SAKAI CHEMICAL INDUSTRY, CO., LTD.)) can be used. By adding the dispersant, the surface smoothness of the magnetic sheet can be increased, and the magnetic permeability and the fire retardance can be improved by decreasing the amount of air included in the magnetic sheet and increasing specific gravity. If necessary, various additives, such as a dispersant, stabilizer, lubricant, silane or titanate coupling agent, filler, plasticizer, and antioxidant may be added.

When an ethylene-vinyl acetate copolymer is used as the binder, the melamine cyanurate treated with fatty acid (carboxylic acid amide-containing melamine cyanurate) has better dispersibility than the melamine cyanurate treated with a silane coupling agent (silicon atom-containing melamine cyanurate). Thus, particularly when the melamine cyanurate treated with fatty acid is used, the amount of air included in the magnetic sheet is decreased, so as to increase the specific gravity, thereby improving the magnetic permeability and the fire retardance.

The amount of the other component is suitably selected depending on the amounts of the binder, the magnetic powder and the fire retardant, without any restriction.

—Application—

The application of the magnetic sheet of the present invention is suitably selected depending on the intended purpose without any restriction. For example, the magnetic sheet may be cut into a desirable size, and disposed in an electronic equipment so that the magnetic sheet is placed adjacent to a noise source of the electronic equipment.

—Use—

As the magnetic sheet of the present invention contains at least one of the silicon atom-containing melamine cyanurate and the carboxylic acid amide-containing melamine cyanurate as the fire retardant, the magnetic sheet satisfies both the high fire retardance and magnetic permeability. When an acrylic rubber and an epoxy resin are used in the magnetic sheet, the magnetic sheet improves the humidity resistance, particularly, suppresses the degradation in the magnetic properties in a high temperature and high humidity environment. An ethylene-vinyl acetate copolymer is used, so that the magnetic sheet can have flexibility, and moreover the magnetic sheet has a less environmental load because the magnetic sheet contains no halogen. The magnetic sheet of the present invention can be suitably used for electromagnetic noise depressors, electromagnetic wave absorbers, magnetic shielding, electronic equipments having IC tag functions such as Radio Frequency Identification (RFID), and non-contact IC cards. Particularly, the magnetic sheet can be suitably used for RFID functioned mobile phones.

A method for producing the magnetic sheet of the present invention is suitably selected from known methods depending on the intended purpose without any restriction. For example, the magnetic sheet can be suitably produced by the following method.

<Production Method>

A method for producing the magnetic sheet includes at least applying a magnetic composition onto a substrate, and forming the magnetic sheet, and further includes other suitably selected steps, as necessary.

—Magnetic Composition—

The magnetic composition contains at least a binder, a magnetic powder, and a fire retardant, and further contains suitably selected other components as necessary. The fire retardant contains at least one of the silicon atom-containing melamine cyanurate and the carboxylic acid amide-containing melamine cyanurate, and preferably further contains red phosphorus.

The details of the binder, the magnetic powder, the fire retardant (i.e. the silicon atom-containing melamine cyanurate, the carboxylic acid amide-containing melamine cyanurate, and the red phosphorus) and other components are as described above.

—Substrate—

The substrate is suitably selected depending on the intended purpose without any restriction, but it is preferably a polyester film a surface of which is lubrication processed (a release PET) as the formed magnetic layer can be easily peeled from the substrate.

—Coating—

A method for coating is suitably selected depending on the intended purpose without any restriction. Examples thereof include spin coating, dip coating, kneader coating, curtain coating, blade coating, and doctor blade coating. Of these, the blade coating, and the doctor blade coating are preferable, in terms of excellent coating efficiency.

—Formation—

A method of forming the magnetic sheet is suitably selected depending on the intended purpose without any restriction. For example, the magnetic sheet can be formed by hot pressing.

A method of hot pressing is suitably selected depending on the intended purpose without any restriction. For example, both sides of a layer of the magnetic composition applied on the substrate are sandwiched with press plates respectively via buffer materials, and heated and pressed.

The conditions for the hot pressing are suitably adjusted depending on the intended purpose without any restriction. For example, the temperature is preferably 80° C. to 190° C., the pressure is preferably 5 MPa to 20 MPa, and the duration is preferably 1 minute to 20 minutes.

The structure, thickness, and material of the buffer material are suitably selected depending on the indented purpose without any restriction.

The buffer material may be a commercially available product or arbitrarily prepared product. Examples of the commercially available product include a high quality paper (product name: OK Prince High Quality 70, manufacturer: Oji Paper Co., Ltd., Bekk smoothness: 6.2 sec/mL), a cushioned paper (product name: TF190, manufacturer: THE TOYO FIBRE CO., LTD., Bekk smoothness: 1.7 sec/mL), nylon mesh (product name: N-NO. 1105, manufacturer: TOKYO SCREEN CO., LTD., Bekk smoothness: less than 0.1 sec/mL), cotton cloth (product name: Kanakin No. 3, manufacturer: Japanese Standards Association, Bekk smoothness: less than 0.1 sec/mL), a base paper for an adhesive (product name: SO base paper 18G, manufacturer: DAIFUKU PAPER MFG CO., LTD., Bekk smoothness: less than 0.1 sec/mL), a double sided release paper (product name: 100GVW (High lubricity surfaces), manufacturer: Oji Paper Co., Ltd., Bekk smoothness: 146 sec/mL), and a double sided release paper (product name: 100GVW (Low lubricity surfaces), manufacturer: Oji Paper Co., Ltd., Bekk smoothness: 66 sec/mL).

Bekk smoothness expresses the time required for a certain amount of air to pass through the surface having some irregularities of a sheet member such as paper and a cloth. The larger the degree of the irregularities on the surface of the sheet member, the smaller the value of Bekk smoothness is, namely meaning excellent "lubricity".

Bekk smoothness is measured, for example, by Bekk Smoothness Tester (manufactured by TESTER SANGYO CO., LTD.).

Moreover, the buffer material preferably has irregularities on the surface thereof, namely preferably has an aeration portion through which gas can flow. The aeration portion can let out outgas or air, when the outgas is generated or the air contained in the magnetic sheet is released upon hot pressing. Thus, after hot pressing, a patchy pattern (a pattern consisting of gloss portions and non-gloss portions) will not be formed on the surface of the magnetic sheet, so that degradation of appearance due to the patchy pattern can be prevented.

As mentioned above, the magnetic composition is applied on the substrate, and formed into the magnetic sheet. Here, the magnetic sheet is obtained in such a state that the magnetic sheet is laminated on the substrate (release PET), but the magnetic sheet can be peeled from the substrate and used.

EXAMPLES

Hereinafter, Examples of the present invention will be explained, but these examples shall not be construed as limiting the scope of the present invention.

Example 1

Production of Magnetic Sheet

At first, in 270 parts by mass of toluene and 120 parts by mass of ethyl acetate, 73.5 parts by mass of an acrylic rubber having epoxy groups (SG80H-3, manufactured by Nagase ChemteX Corporation, a number average molecular mass of 150,000, a mass average molecular mass of 350,000, a molecular mass of 300,000 to 500,000, Tg of 11° C., containing epoxy groups and hydroxyl groups, a main monomer; ethyl acrylate (EA) acrylonitrile (AN)) used as a binder, 20.4 parts by mass of an epoxy resin (EPICOAT (now named as jER®) 1031S, manufactured by Japan Epoxy Resins Co., Ltd.), and 6.1 parts by mass of a latent curing agent (HX3748, manufactured by Asahi Kasei Chemicals Corporation) were dissolved so as to prepare a resin composition. To the resin composition, 500 parts by mass of a flat magnetic powder (JEM-S, manufactured by Mitsubishi Materials Corporation) used as a magnetic powder, 109.1 parts by mass of a silicon atom-containing melamine cyanurate (melamine cyanurate whose surface was treated with a silicon compound, MC-5S, manufactured by SAKAI CHEMICAL INDUSTRY, CO., LTD., a number average particle size of 0.5 μm) and 6.8 parts by mass of red phosphorus (ST-100, manufactured by RINKAGAKU KOGYO CO., LTD.) were added, and the obtained mixture was mixed so as to prepare a magnetic composition.

The thus obtained magnetic composition was applied onto a polyester film a surface of which had been lubrication processed (a release PET) (38GS manufactured by Lintec Corporation, thickness of 38 μm) as a substrate using a bar coater, so as to form a layer having a thickness of 185 μm, and then four layers of the magnetic composition were laminated.

Next, on both surfaces of the laminate, which consisted of the release PET, and the four layers of the magnetic composition formed on the release PET, high quality paper (product name: OK Prince High Quality 70, manufacturer: Oji Paper Co., Ltd., thickness: 100 μm, Bekk smoothness: 6.2 sec/mL) used as buffer material were stacked. Then, the stacked buffer materials were hot-pressed by means of press plates using a vacuum press (manufactured by KITAGAWA SEIKI Co., Ltd.) under the conditions of a temperature of 170° C., a duration of 10 minutes, and a pressure of 9 MPa.

Thereafter, the resultant product was cut into a sample of 250 mm×250 mm in size, and the release PET was removed, to thereby produce a magnetic sheet.

<Confirmation of Presence of Silicon Atom in Melamine Cyanurate>

Figure 1B:
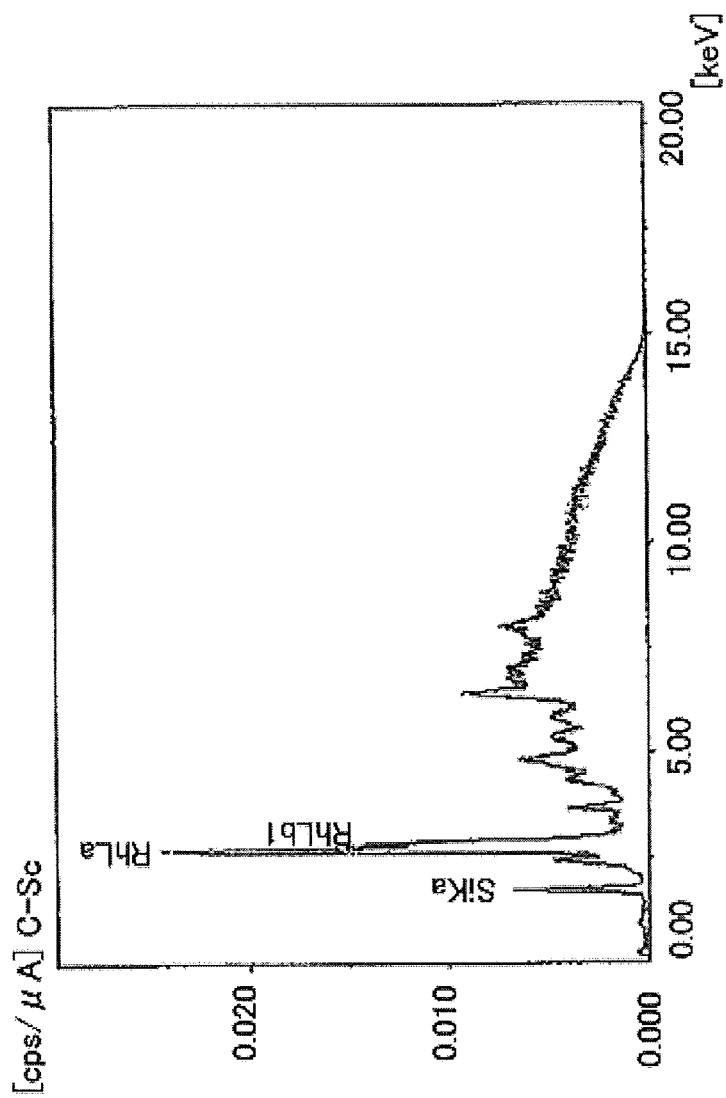
Figure 1C:
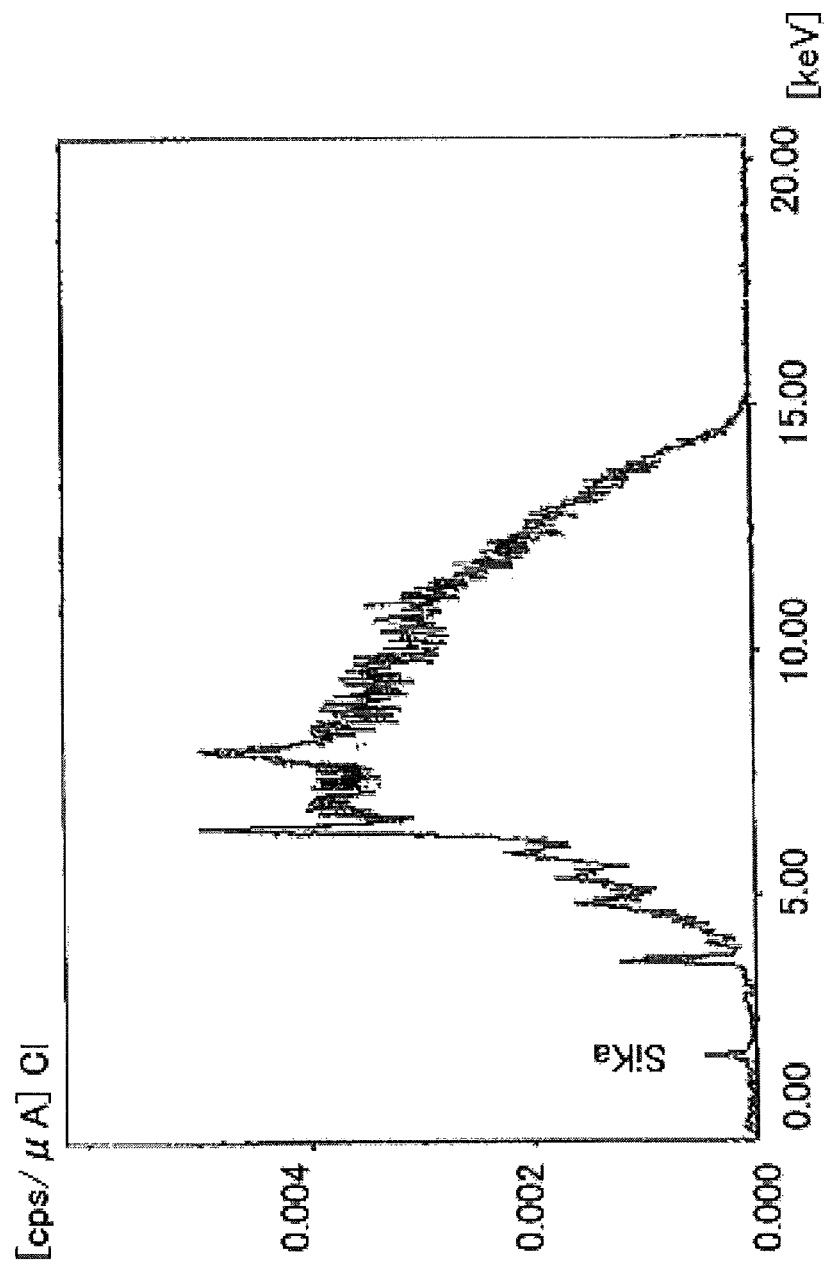
Figure 1D:
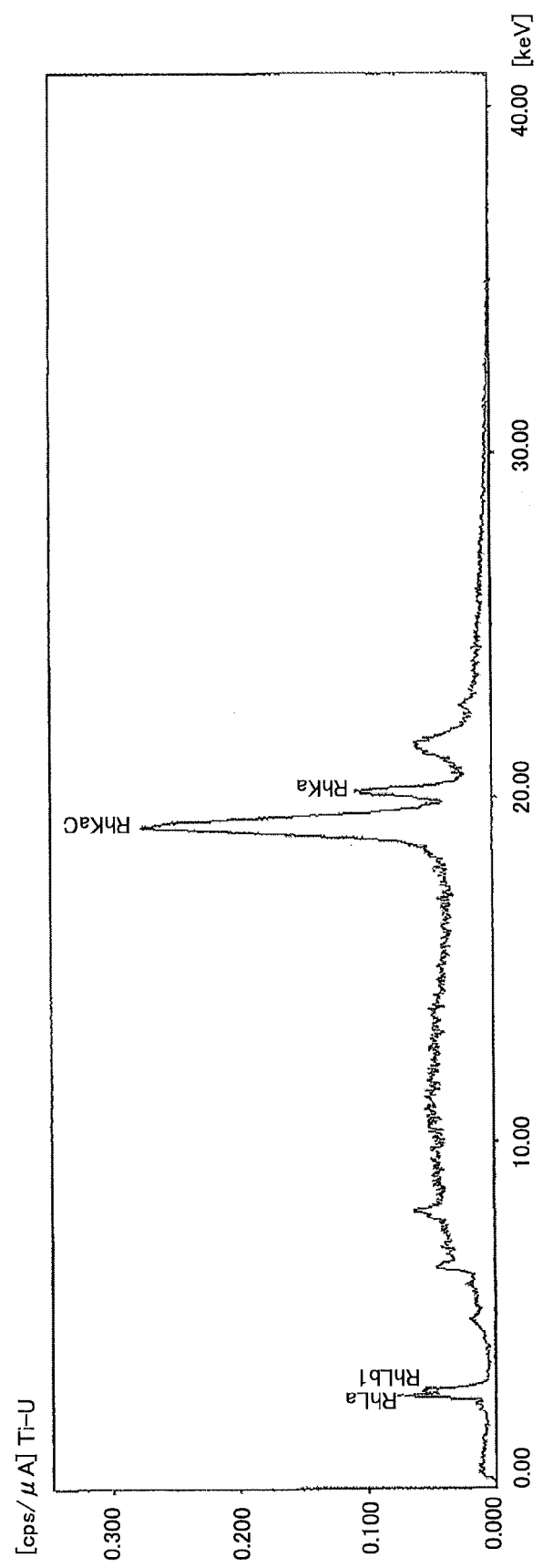
FIGS. 1D to 1F are graphs showing XRF measurement data of non-surface treated melamine cyanurate (MC-20N) for comparison with FIGS. 1A to 1C.
Figure 1E:
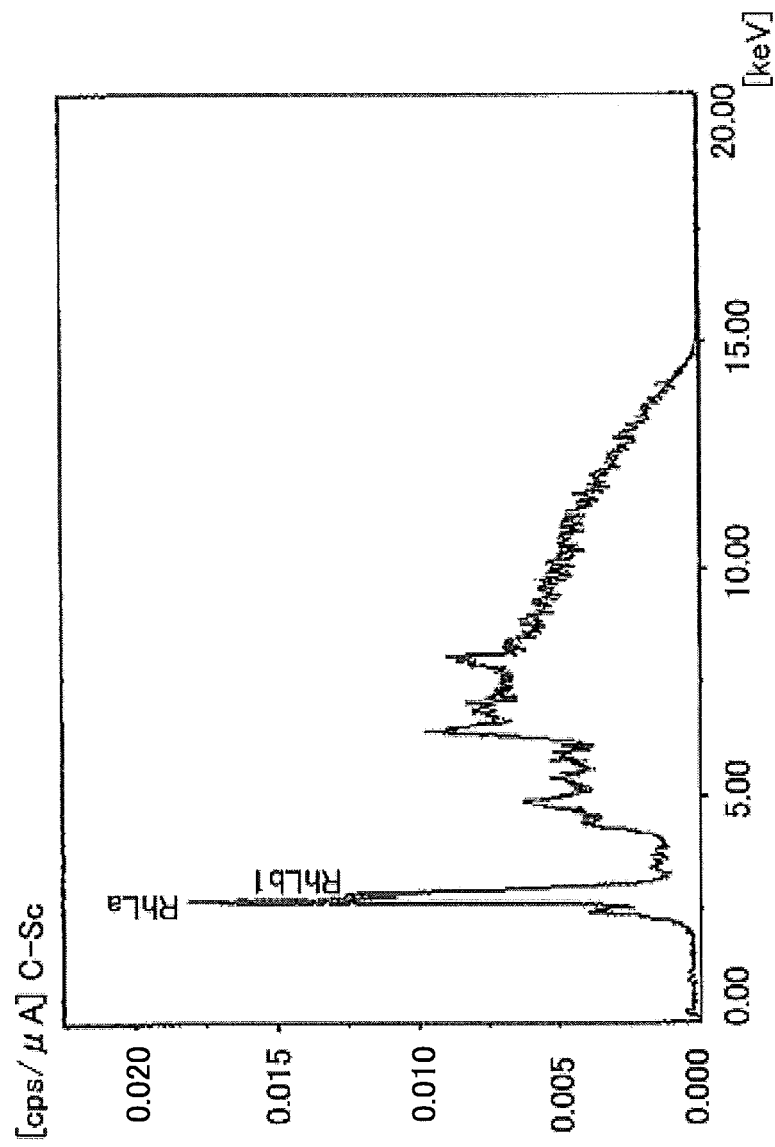
Figure 1F:
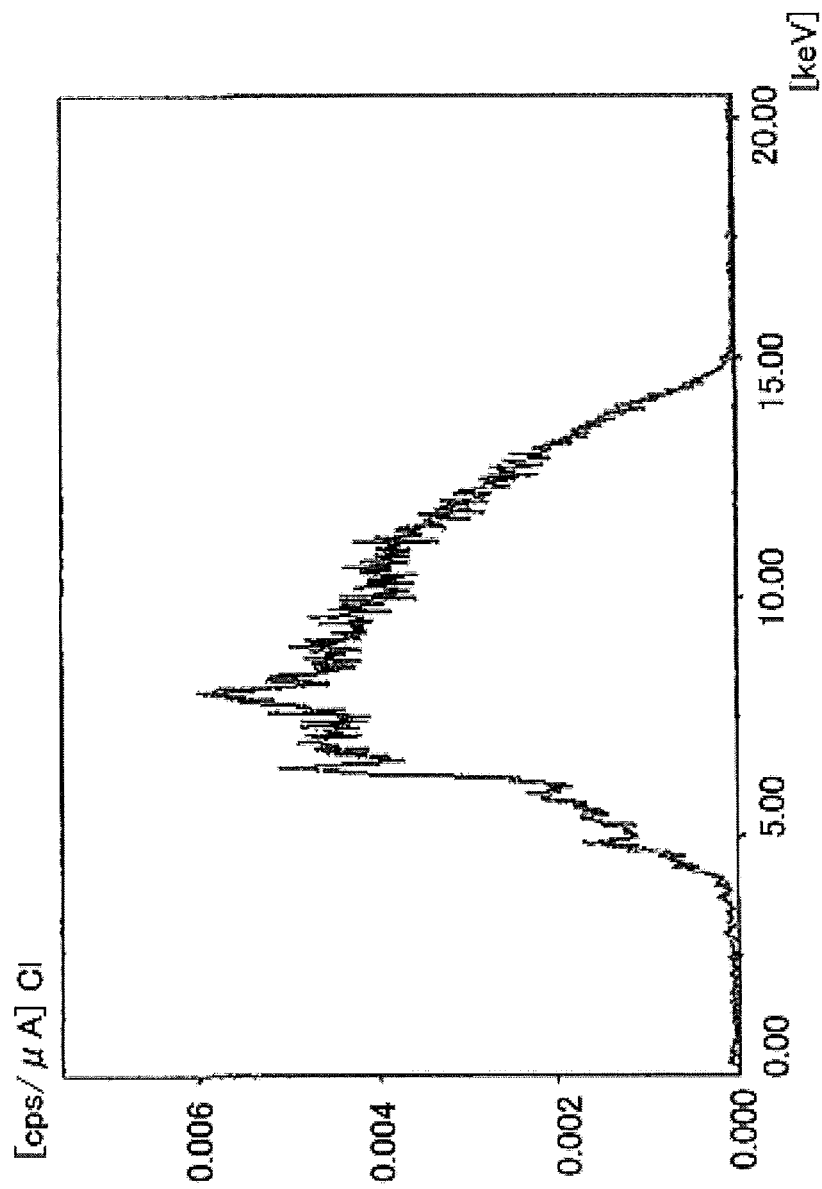
Figure 1G:
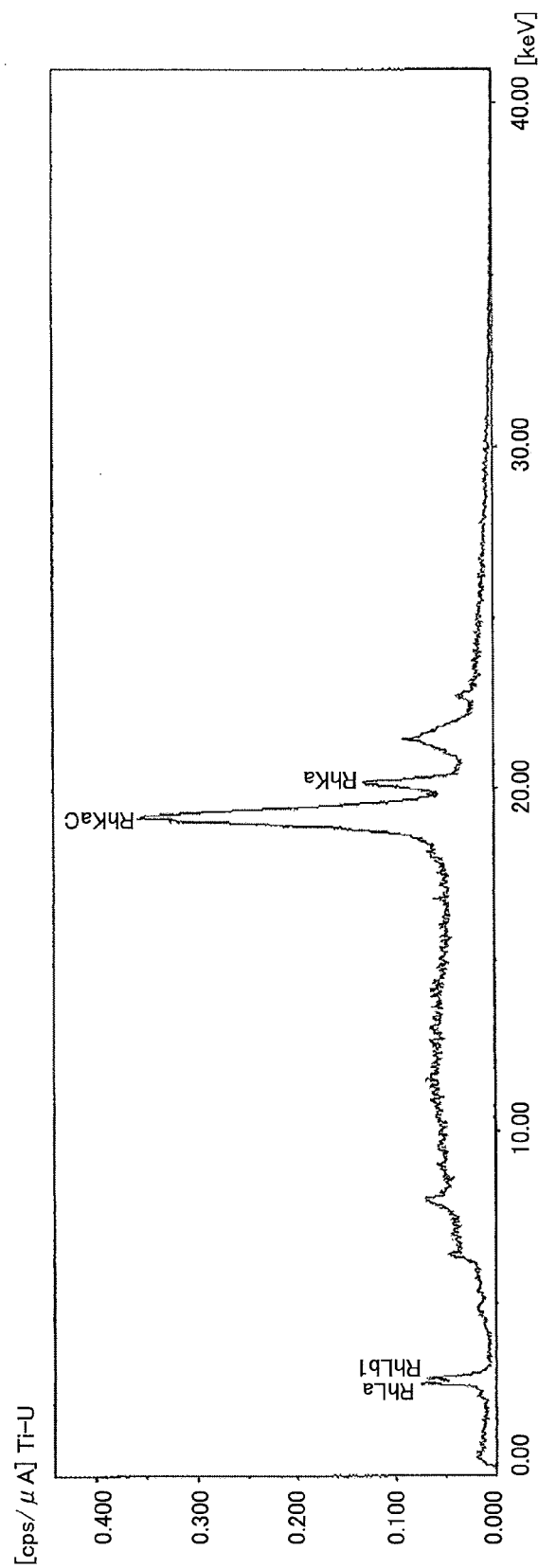
Figure 1H:
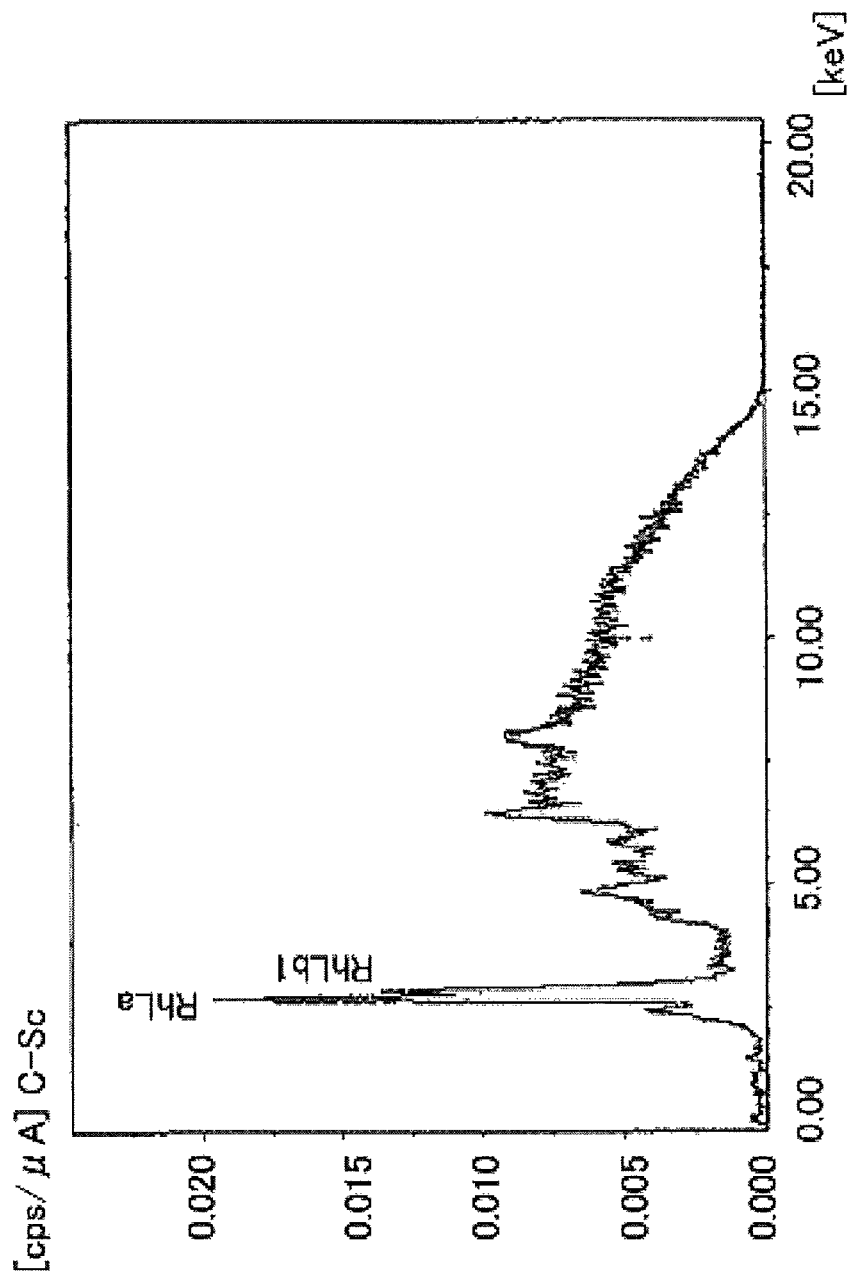

After the obtained magnetic sheet was immersed in toluene, the magnetic sheet was pulverized in a mortar, and the obtained pulverized product was dispersed in toluene. Then, the pulverized product was separated into the magnetic powder and the binder by centrifugation, and components in the binder were separated and extracted, and MC-5S (manufactured by SAKAI CHEMICAL INDUSTRY, CO., LTD.) used as the fire retardant was subjected to X-ray fluorescence analysis (XRF). The XRF measurement data is shown in FIGS. 1A to 1C. For comparison, as melamine cyanurate (no surface treatment), the XRF measurement data of MC-20N (manufactured by SAKAI CHEMICAL INDUSTRY, CO., LTD.) is shown in FIGS. 1D to 1F, the XRF measurement data of MC-40N (manufactured by SAKAI CHEMICAL INDUSTRY, CO., LTD.) is shown in FIGS. 1G to 1I. From FIGS. 1A to 1I, only in the XRF measurement data of MC-5S, a silicon atom was detected, and it was confirmed that MC-5S contained the silicon atom.

Examples 2 to 7

Production of Magnetic Sheet

Each of magnetic sheets was produced in the same manner as in Example 1, except that the amount of at least one of the magnetic powder and the fire retardant in Example 1 was changed to those as shown in Tables 1 and 2.

Example 8

Production of Magnetic Sheet

A magnetic sheet was produced in the same manner as in Example 1, except that the silicon atom-containing melamine cyanurate (melamine cyanurate whose surface was treated with a silicon compound, MC-5S, manufactured by SAKAI CHEMICAL INDUSTRY, CO., LTD.) used as the fire retardant was replaced with carboxylic acid amide-containing melamine cyanurate (melamine cyanurate whose surface was treated with a lauric acid used as fatty acid, MC-5F, manufactured by SAKAI CHEMICAL INDUSTRY, CO., LTD., a number average particle size of 0.5 μm).

<Confirmation of Presence of Carboxylic Acid Amide in Melamine Cyanurate>

Figure 2A:
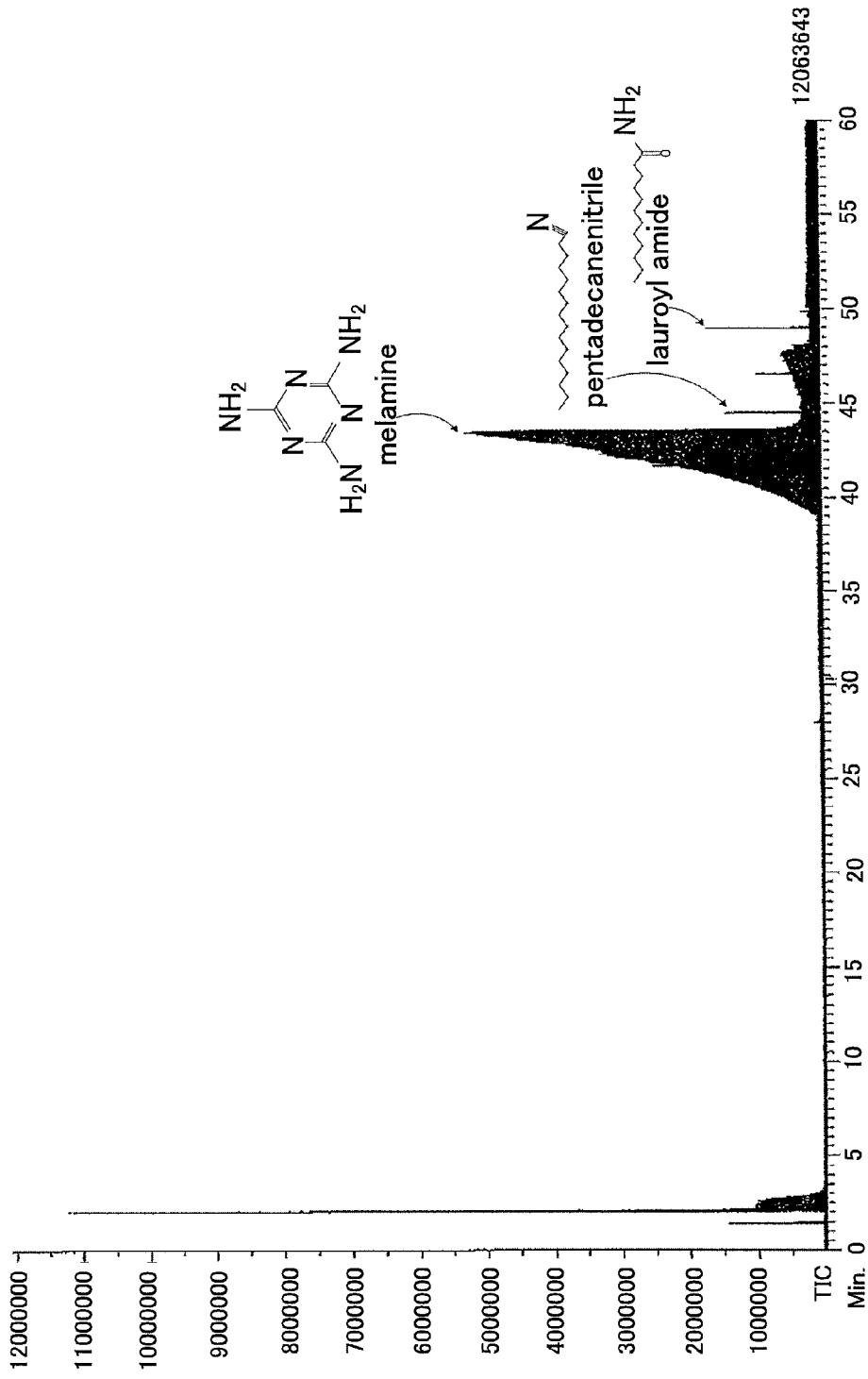
FIG. 2A is a graph showing Py-GC-MS measurement data of a fire retardant (MC-5F) used in Example 8.
Figure 2B:
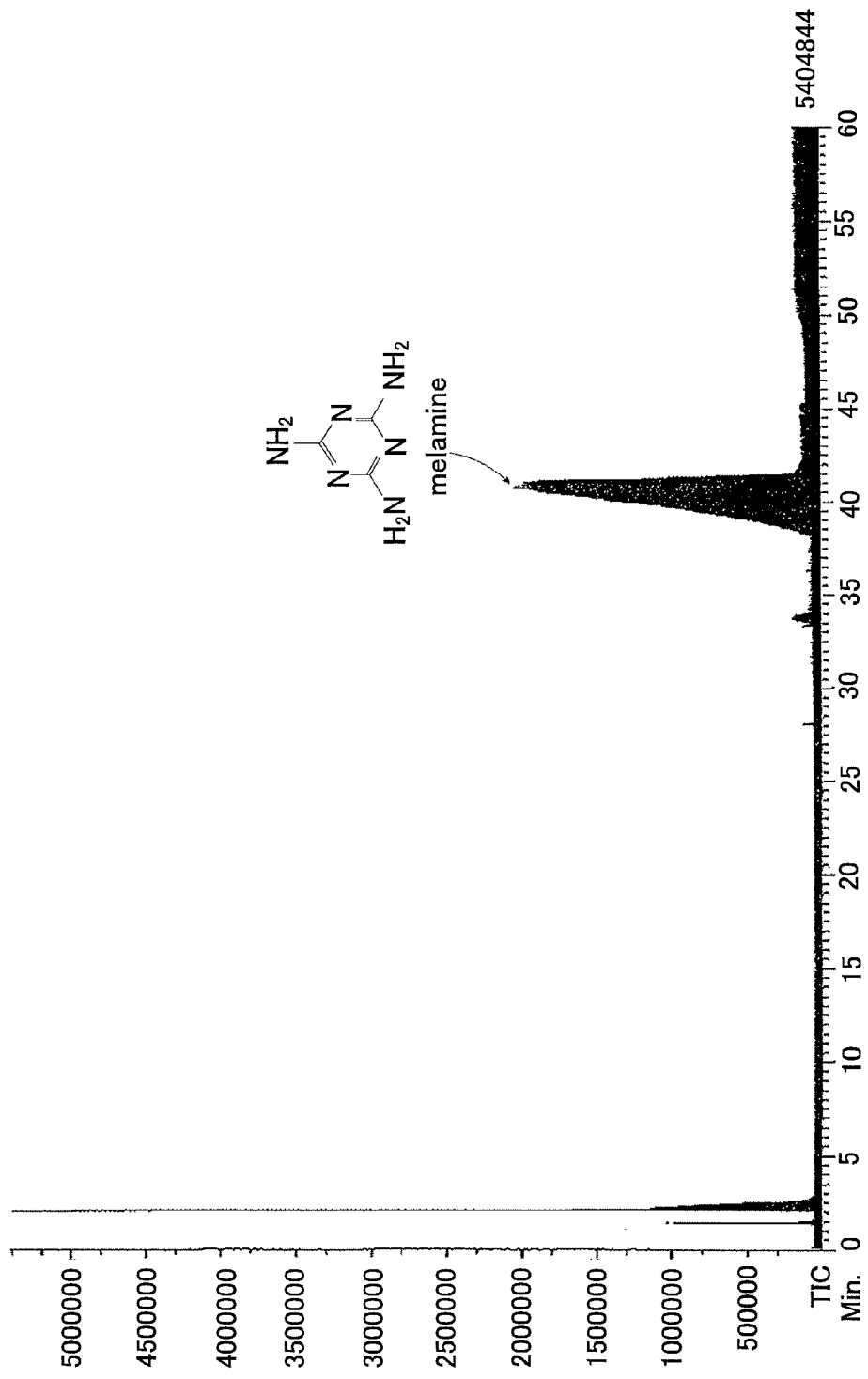
FIG. 2B is a graph showing Py-GC-MS measurement data of non-surface treated melamine cyanurate (MC-20N) for comparison with FIG. 2A.
Figure 2C:
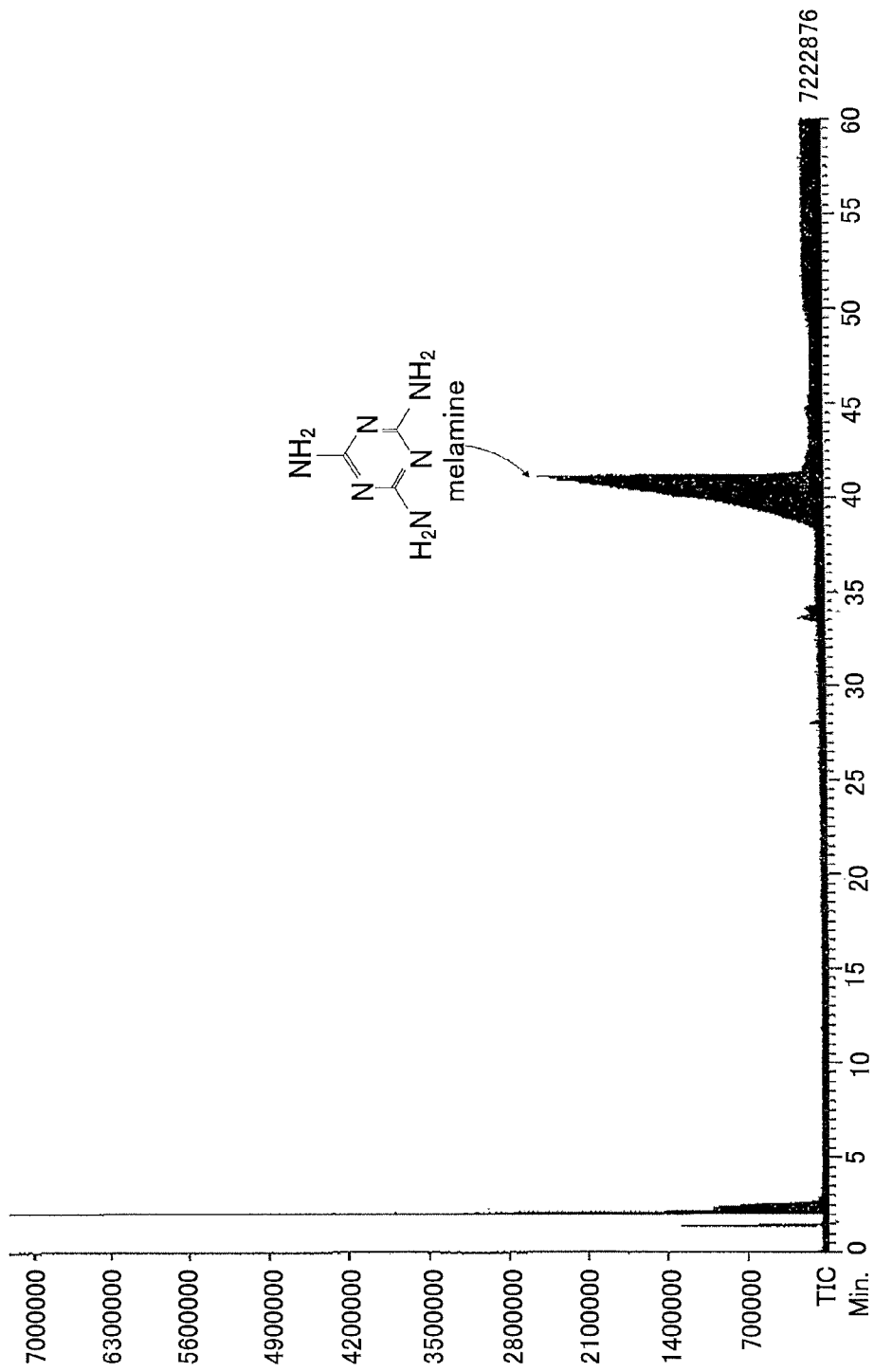
FIG. 2C is a graph showing Py-GC-MS measurement data of non-surface treated melamine cyanurate (MC-40N) for comparison with FIG. 2A.

After the obtained magnetic sheet was immersed in toluene, the magnetic sheet was pulverized in a mortar, and the obtained pulverized product was dispersed in toluene. Then, the pulverized product was separated into the magnetic powder and the binder by centrifugation, and components in the binder were separated and extracted, and MC-5F (manufactured by SAKAI CHEMICAL INDUSTRY, CO., LTD.) used as the fire retardant was subjected to pyrolysis gas chromatography analysis (Py-GC-MS). The Py-GC-MS measurement data is shown in FIG. 2A. For comparison, as melamine cyanurate (no surface treatment), the Py-GC-MS measurement data of MC-20N (manufactured by SAKAI CHEMICAL INDUSTRY, CO., LTD.) is shown in FIG. 2B, the Py-GC-MS measurement data of MC-40N (manufactured by SAKAI CHEMICAL INDUSTRY, CO., LTD.) is shown in FIG. 2C. From FIGS. 2A to 2C, only in the Py-GC-MS measurement data of MC-5F, lauroyl amide was detected, and it was confirmed that MC-5F contained the carboxylic acid amide.

Figure 3A:
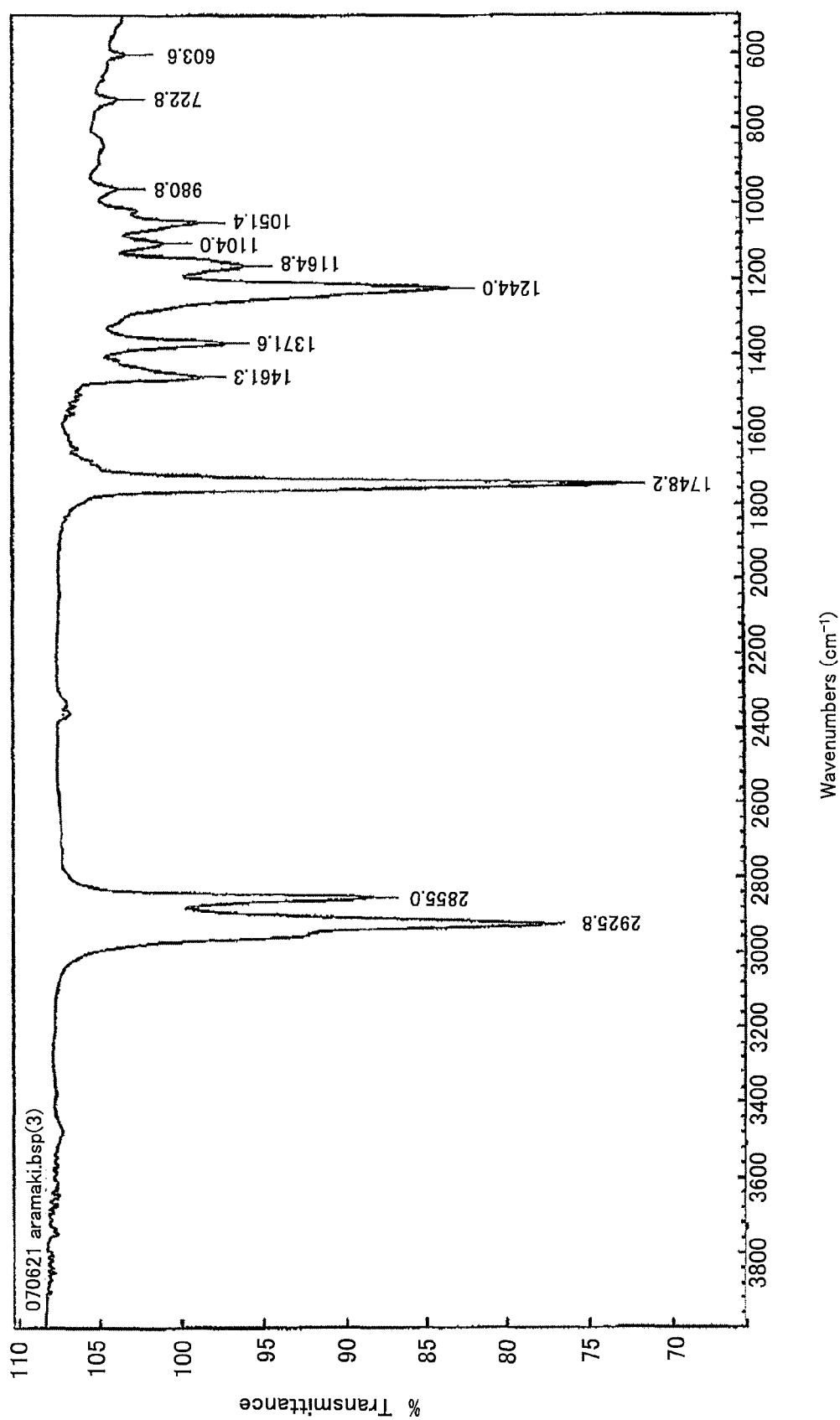
FIG. 3A is a graph showing IR measurement data of a concentrate of the toluene wash liquid which has been used for washing a magnetic powder.
Figure 3B:
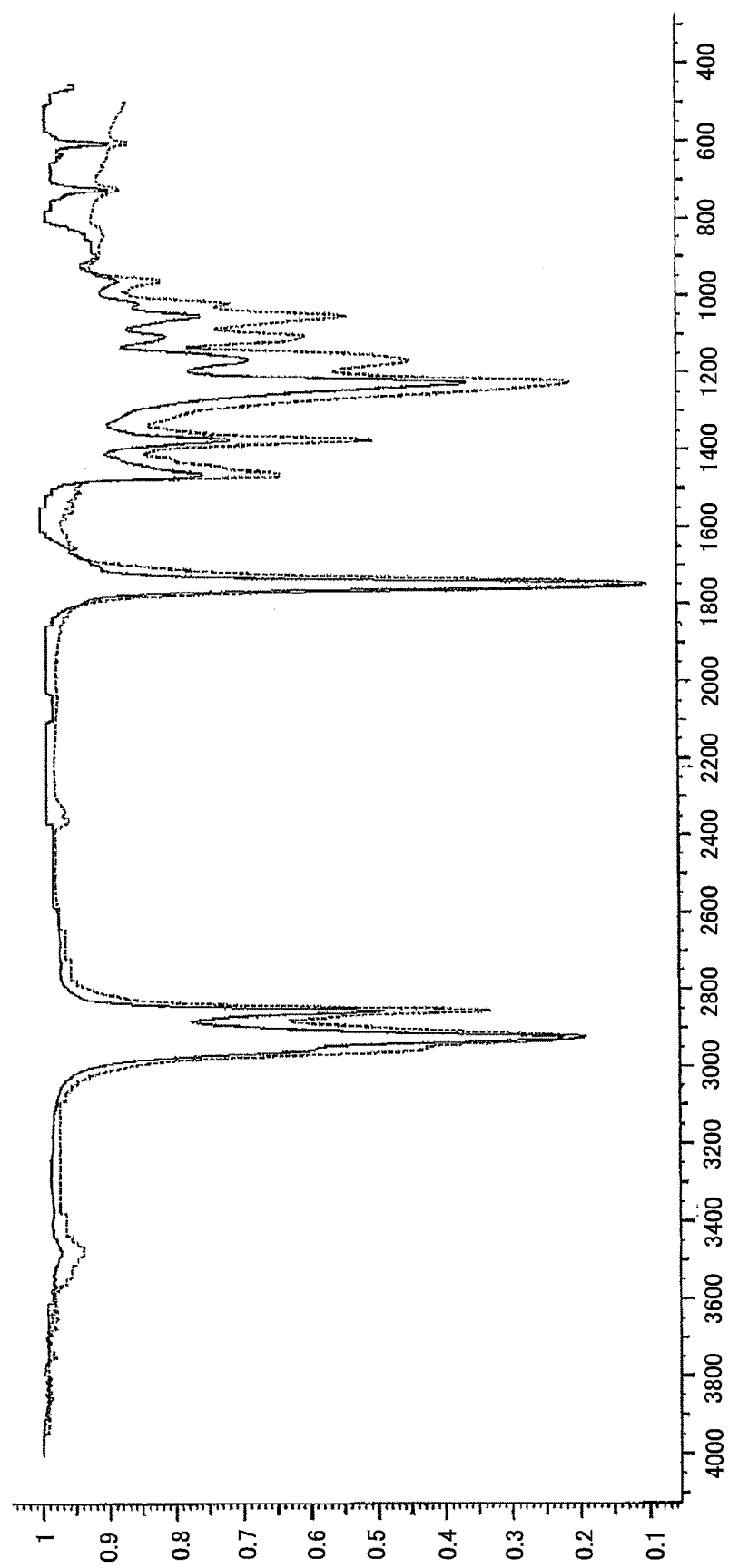
FIG. 3B is a graph showing a result of a library search, which shows the match between the toluene wash liquid of a magnetic powder and glyceride.

The magnetic powder extracted by centrifugation was washed with toluene, only a supernatant of the washing liquid was recovered, and toluene was distilled away at reduced pressure using an evaporator. Then, the residue (concentrate of the toluene wash liquid) was analyzed by infrared spectroscopy (IR). The IR measurement data is shown in FIG. 3A. In FIG. 3A, OH stretching vibration derived from a hydroxyl group could not be observed. Then, library search was performed, and as shown in FIG. 3B, it was found that the concentrate of the toluene wash liquid was glyceride, which was a type of fatty acid ester (an ester compound of glycerin and fatty acid), and that carboxylic acid amide was not contained in the magnetic powder. In FIG. 3B, a solid line represents the concentrate of the toluene wash liquid, and a dashed line represents library (glyceride).

Example 9

Production of Magnetic Sheet

A magnetic sheet was produced in the same manner as in Example 8, except that the flat magnetic powder (JEM-S, manufactured by Mitsubishi Materials Corporation) used as the magnetic powder in Example 8 was replaced with a flat magnetic powder (EMS-10, manufactured by Mitsubishi Materials Corporation), and that the amount of the red phosphorus was changed to that shown in Table 2.

Examples 10 and 11

Production of Magnetic Sheet

Each of magnetic sheets was produced in the same manner as in Example 1, except that the amounts of the silicon atom-containing melamine cyanurate and the red phosphorus in Example 1 were changed to those shown in Tables 2 and 3.

Example 12

Production of Magnetic Sheet

A magnetic sheet was produced in the same manner as in Example 1, except that the flat magnetic powder (JEM-S, manufactured by Mitsubishi Materials Corporation) used as the magnetic powder was replaced with a flat magnetic powder (JEM-G2, manufactured by Mitsubishi Materials Corporation), that carboxylic acid amide-containing melamine cyanurate (MC-5F, manufactured by SAKAI CHEMICAL INDUSTRY, CO., LTD.) used as the fire retardant was further added, and that the amounts of the silicon atom-containing melamine cyanurate and the red phosphorus were changed to those shown in Table 3.

Examples 13 and 14

Production of Magnetic Sheet

A magnetic sheet was produced in the same manner as in Example 1, except that the carboxylic acid amide-containing melamine cyanurate (MC-5F, manufactured by SAKAI CHEMICAL INDUSTRY, CO., LTD.) used as the fire retardant was further added, and that the amounts of the silicon atom-containing melamine cyanurate and the red phosphorus were changed to those shown in Table 3.

Examples 15 to 20

Production of Magnetic Sheet

Each of magnetic sheets was produced in the same manner as in Example 1, except that the amounts of the silicon atom-containing melamine cyanurate and the red phosphorus in Example 1 were changed to those shown in Tables 3 and 4.

Comparative Example 1

Production of Magnetic Sheet

A magnetic sheet was produced in the same manner as in Example 4, except that the silicon atom-containing melamine cyanurate in Example 4 was replaced with melamine cyanurate (non-surface treated melamine cyanurate, MC4000, manufactured by Nissan Chemical Industries, Ltd.).

Comparative Example 2

Production of Magnetic Sheet

A magnetic sheet was produced in the same manner as in Example 4, except that the silicon atom-containing melamine cyanurate in Example 4 was replaced with melamine cyanurate (non-surface treated melamine cyanurate, MC6000, manufactured by Nissan Chemical Industries, Ltd.).

Comparative Example 3

Production of Magnetic Sheet

A magnetic sheet was produced in the same manner as in Example 4, except that the silicon atom-containing melamine cyanurate in Example 4 was replaced with melamine polyphosphate (PMP100, manufactured by Nissan Chemical Industries, Ltd.).

Comparative Example 4

Production of Magnetic Sheet

A magnetic sheet was produced in the same manner as in Example 4, except that the silicon atom-containing melamine cyanurate in Example 4 was replaced with melamine polyphosphate (PMP200, manufactured by Nissan Chemical Industries, Ltd.).

Comparative Example 5

Production of Magnetic Sheet

A magnetic sheet was produced in the same manner as in Example 4, except that the silicon atom-containing melamine cyanurate in Example 4 was replaced with magnesium hydroxide (MGZ-3, manufactured by SAKAI CHEMICAL INDUSTRY, CO., LTD.).

Comparative Example 6

Production of Magnetic Sheet

A magnetic sheet was produced in the same manner as in Example 4, except that the silicon atom-containing melamine cyanurate in Example 4 was replaced with ammonium polyphosphate (AP462, manufactured by Clariant(Japan)K.K.).

Comparative Example 7

Production of Magnetic Sheet

A magnetic sheet was produced in the same manner as in Example 4, except that the silicon atom-containing melamine cyanurate in Example 4 was replaced with ammonium polyphosphate (FCP-770, manufactured by SUZUHIRO CHEMICAL CO., LTD.).

Comparative Example 8

Production of Magnetic Sheet

A magnetic sheet was produced in the same manner as in Example 4, except that the silicon atom-containing melamine cyanurate in Example 4 was replaced with coating ammonium polyphosphate (TERRAJU C-80, manufactured by Budenheim Iberica Comercial, S.A.).

Comparative Example 9

Production of Magnetic Sheet

A magnetic sheet was produced in the same manner as in Example 4, except that the silicon atom-containing melamine cyanurate in Example 4 was replaced with ammonium polyphosphate (FRCROSS486, manufactured by Budenheim Ibérica Comercial, S.A.).

Comparative Example 10

Production of Magnetic Sheet

A magnetic sheet was produced in the same manner as in Comparative Example 1, except that the flat magnetic powder (JEM-S, manufactured by Mitsubishi Materials Corporation) used as the magnetic powder in Comparative Example 1 was replaced with a flat magnetic powder (EMS-10, manufactured by Mitsubishi Materials Corporation).

Comparative Example 11

Production of Magnetic Sheet

A magnetic sheet was produced in the same manner as in Comparative Example 3, except that the flat magnetic powder (JEM-S, manufactured by Mitsubishi Materials Corporation) used as the magnetic powder in Comparative Example 3 was replaced with a flat magnetic powder (EMS-10, manufactured by Mitsubishi Materials Corporation).

Comparative Example 12

Production of Magnetic Sheet

A magnetic sheet was produced in the same manner as in Comparative Example 4, except that the flat magnetic powder (JEM-S, manufactured by Mitsubishi Materials Corporation) used as the magnetic powder in Comparative Example 4 was replaced with a flat magnetic powder (EMS-10, manufactured by Mitsubishi Materials Corporation).

Example 21

Production of Magnetic Sheet

A magnetic sheet was produced in the same manner as in Example 1, except that (i) 73.5 parts by mass of an acrylic rubber having epoxy groups used as the binder, 20.4 parts by mass of the epoxy resin, and 6.1 parts by mass of the latent curing agent were replaced with an ethylene-vinyl acetate copolymer (LEVAPREN 800HV, manufactured by Bayer AG, the amount and specific gravity of vinyl acetate in the ethylene-vinyl acetate copolymer were respectively 80 mol % and 0.98 g/cm$^3$), that (ii) 500 parts by mass of the flat magnetic powder (JEM-S, manufactured by Mitsubishi Materials Corporation) used as the magnetic powder was replaced with 600 parts by mass of a flat magnetic powder (Fe—Si—Al, EMS-10, manufactured by Mitsubishi Materials Corporation), that (iii) 109.1 parts by mass of the silicon atom-containing melamine cyanurate used as the fire retardant was replaced with 80 parts by mass of carboxylic acid amide-containing melamine cyanurate (melamine cyanurate whose surface treated with lauric acid used as fatty acid, MC-5F, manufactured by SAKAI CHEMICAL INDUSTRY, CO., LTD., a number average particle size of 0.5 μm), and that (iv) 6.8 parts by mass of the red phosphorus used as the fire retardant was replaced with 10 parts by mass of red phosphorus.

Example 22

Production of Magnetic Sheet

A magnetic sheet was produced in the same manner as in Example 21, except that the amount of the carboxylic acid amide-containing melamine cyanurate used as the fire retardant in Example 21 was changed to that shown in Table 7.

The frequency properties of the produced magnetic sheet (thickness: 500 μm) was measured using a network analyzer (N5230A, manufactured by Agilent Technologies). The results are shown in FIGS. 4A and 4B.

Figure 4A:
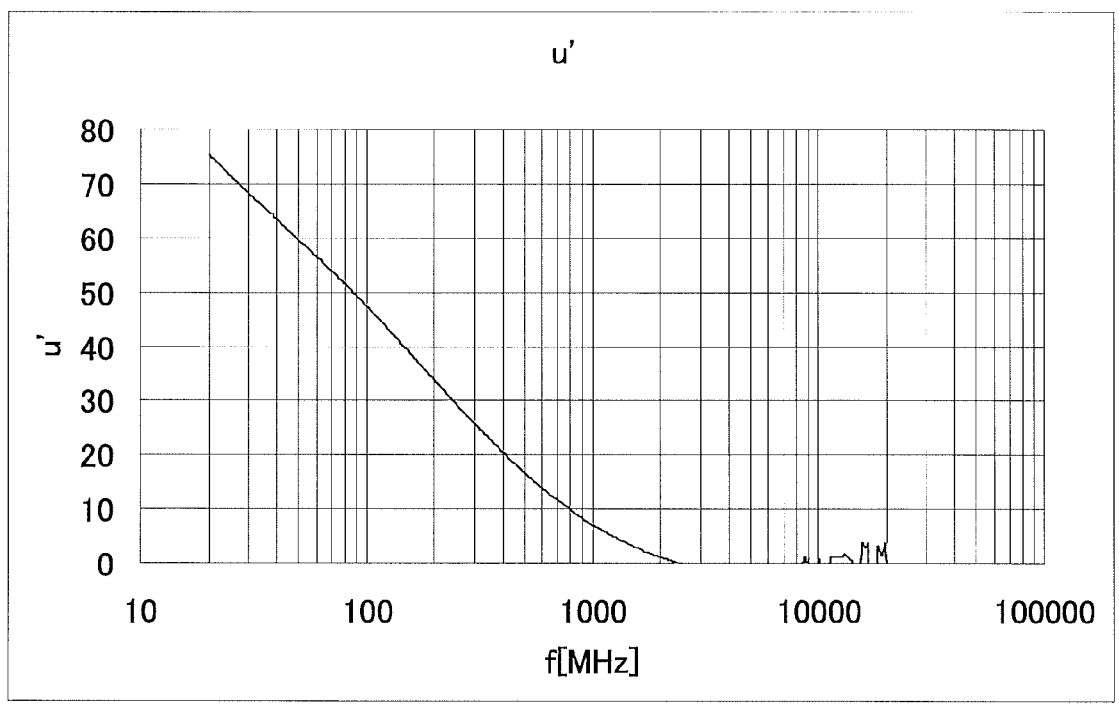
FIG. 4A is a graph showing a measurement result ($\mu'$) of frequency properties of the magnetic sheet produced under the conditions of Example 22 and having a thickness of 500 μm.
Figure 4B:
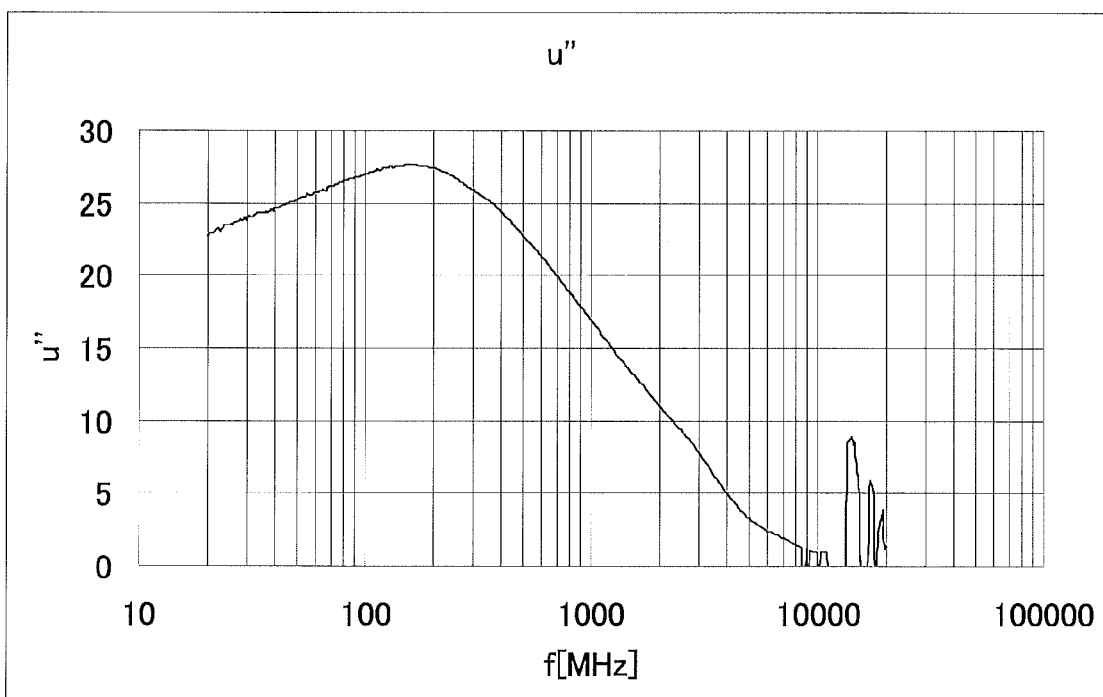
FIG. 4B is a graph showing a measurement result ($\mu''$) of frequency properties of the magnetic sheet produced under the conditions of Example 22 and having a thickness of 500 μm.

As can be seen from FIGS. 4A and 4B, the magnetic sheet had a large magnetic permeability and excellent properties. This magnetic sheet can be used in the KHz to GHz range.

Example 23

Production of Magnetic Sheet

A magnetic sheet was produced in the same manner as in Example 21, except that the amount of the carboxylic acid amide-containing melamine cyanurate used as the fire retardant in Example 21 was changed to that shown in Table 7, and that 5 parts by mass of the aluminum hydroxide (AOH60, manufactured by Nabaltec AG) used as the fire retardant was further added.

Example 24

Production of Magnetic Sheet—

A magnetic sheet was produced in the same manner as in Example 21, except that the amounts of the carboxylic acid amide-containing melamine cyanurate and the red phosphorus used as the fire retardant in Example 21 were changed to those shown in Table 7.

Example 25

Production of Magnetic Sheet

A magnetic sheet was produced in the same manner as in Example 21, except that the ethylene-vinyl acetate copolymer (LEVAPREN 800HV, manufactured by Bayer AG, the amount and specific gravity of vinyl acetate in the ethylene-vinyl acetate copolymer were respectively 80 mol % and 0.98 g/cm$^3$) used as the binder was replaced with an ethylene-vinyl acetate copolymer (EV45LX, manufactured by Du Pont-Mitsui Polychemicals Co., Ltd., the amount and specific gravity of vinyl acetate in the ethylene-vinyl acetate copolymer were respectively 46 mol % and 0.98 g/cm$^3$), and that the amount of the carboxylic acid amide-containing melamine cyanurate used as the fire retardant was changed to that shown in Table 7.

Example 26

Production of Magnetic Sheet

A magnetic sheet was produced in the same manner as in Example 21, except that the ethylene-vinyl acetate copolymer (LEVAPREN 800HV, manufactured by Bayer AG, the amount and specific gravity of vinyl acetate in the ethylene-vinyl acetate copolymer were respectively 80 mol % and 0.98 g/cm$^3$) used as the binder was replaced with an ethylene-vinyl acetate copolymer (LEVAPREN 600HV, manufactured by Bayer AG, the amount and specific gravity of vinyl acetate in the ethylene-vinyl acetate copolymer were respectively 60 mol % and 1.04 g/cm$^3$), and that the amount of the carboxylic acid amide-containing melamine cyanurate used as the fire retardant was changed to that shown in Table 7.

Example 27

Production of Magnetic Sheet

A magnetic sheet was produced in the same manner as in Example 21, except that the ethylene-vinyl acetate copolymer (LEVAPREN 800HV, manufactured by Bayer AG, the amount and specific gravity of vinyl acetate in the ethylene-vinyl acetate copolymer were respectively 80 mol % and 0.98 g/cm$^3$) used as the binder in Example 21 was replaced with an ethylene-vinyl acetate copolymer (LEVAPREN 900HV, manufactured by Bayer AG, the amount and specific gravity of vinyl acetate in the ethylene-vinyl acetate copolymer were respectively 90 mol % and 1.15 g/cm$^3$).

Example 28

Production of Magnetic Sheet

A magnetic sheet was produced in the same manner as in Example 21, except that the amount of the flat magnetic powder (Fe—Si—Al; EMS-10) used as the magnetic powder and the amount of the carboxylic acid amide-containing melamine cyanurate used as the fire retardant in Example 21 were changed to those shown in Table 7.

Comparative Example 13

Production of Magnetic Sheet

A magnetic sheet was produced in the same manner as in Example 21, except that the carboxylic acid amide-containing melamine cyanurate as the fire retardant was replaced with ammonium polyphosphate (FCP-770, manufactured by SUZUHIRO CHEMICAL CO., LTD.), and that the amount of the flat magnetic powder used as the magnetic powder was changed to that shown in Table 8.

Comparative Example 14

Production of Magnetic Sheet

A magnetic sheet was produced in the same manner as in Comparative Example 13, except that the ammonium polyphosphate used as the fire retardant in Comparative Example 13 was replaced with aluminum hydroxide (AOH60, manufactured by Nabaltec AG).

Comparative Example 15

Production of Magnetic Sheet

A magnetic sheet was produced in the same manner as in Comparative Example 13, except that the ammonium polyphosphate used as the fire-retardant in Comparative Example 13 was replaced with magnesium hydroxide (MGZ-3, manufactured by SAKAI CHEMICAL INDUSTRY, CO., LTD.).

Comparative Example 16

Production of Magnetic Sheet

A magnetic sheet was produced in the same manner as in Comparative Example 15, except that 10 parts by mass of aluminum hydroxide (AOH60, manufactured by Nabaltec AG) as the fire retardant was further added, and the amount of the flat magnetic powder used as the magnetic powder was changed to that shown in Table 8.

Comparative Example 17

Production of Magnetic Sheet

A magnetic sheet was produced in the same manner as in Example 21, except that the carboxylic acid amide-containing melamine cyanurate used as the fire retardant in Example 21 was replaced with melamine cyanurate (non-surface treated melamine cyanurate, MC4000, manufactured by Nissan Chemical Industries, Ltd.).

Comparative Example 18

Production of Magnetic Sheet

A magnetic sheet was produced in the same manner as in Example 21, except that the carboxylic acid amide-containing melamine cyanurate used as the fire retardant in Example 21 was replaced with melamine polyphosphate (PMP100, manufactured by Nissan Chemical Industries, Ltd.).

Comparative Example 19

Production of Magnetic Sheet

A magnetic sheet was produced in the same manner as in Example 21, except that the carboxylic acid amide-containing melamine cyanurate used as the fire retardant in Example 21 was replaced with melamine polyphosphate (PMP200, manufactured by Nissan Chemical Industries, Ltd.).

Comparative Example 20

Production of Magnetic Sheet

A magnetic sheet was produced in the same manner as in Example 21, except that the carboxylic acid amide-containing melamine cyanurate used as the fire retardant in Example 21 was replaced with ammonium polyphosphate ("FCP-770"; manufactured by SUZUHIRO CHEMICAL CO., LTD.).

Comparative Example 21

Production of Magnetic Sheet

A magnetic sheet was produced in the same manner as in Example 21, except that the carboxylic acid amide-containing melamine cyanurate used as the fire retardant in Example 21 was replaced with coating ammonium polyphosphate (TERRAJU C-80, manufactured by Budenheim Iberica Comercial, S.A.).

Comparative Example 22

Production of Magnetic Sheet

A magnetic sheet was produced in the same manner as in Example 21, except that the carboxylic acid amide-containing melamine cyanurate used as the fire retardant in Example 21 was replaced with ammonium polyphosphate (FRCROSS 486, manufactured by Budenheim Iberica Comercial, S.A.).

Comparative Example 23

Production of Magnetic Sheet

A magnetic sheet was produced in the same manner as in Example 21, except that the carboxylic acid amide-containing melamine cyanurate used as the fire retardant in Example 21 was replaced with aluminum hydroxide (AOH60, manufactured by Nabaltec AG).

Comparative Example 24

Production of Magnetic Sheet

A magnetic sheet was produced in the same manner as in Example 21, except that the carboxylic acid amide-containing melamine cyanurate used as the fire retardant in Example 21 was replaced with magnesium hydroxide (MGZ-3, manufactured by SAKAI CHEMICAL INDUSTRY, CO., LTD.).

Example 29

Production of Magnetic Sheet

A magnetic sheet was produced in the same manner as in Example 1, except that (i) 73.5 parts by mass of an acrylic rubber having epoxy groups (SG80H-3, manufactured by Nagase ChemteX Corporation, a number average molecular mass of 150,000, a mass average molecular mass of 350,000, a molecular mass of 300,000 to 500,000, Tg of 11° C., containing epoxy groups and hydroxyl groups, a main monomer; ethyl acrylate (EA)/acrylonitrile (AN)) used as a binder, 20.4 parts by mass of an epoxy resin (EPICOAT (now named as jER®) 1031S, manufactured by Japan Epoxy Resins Co., Ltd.), and 6.1 parts by mass of a latent curing agent (HX3748, manufactured by Asahi Kasei Chemicals Corporation) were replaced with 92 parts by mass of an acrylic rubber A (SG series, manufactured by Nagase ChemteX Corporation, a molecular mass of 400,000 to 600,000, Tg of −25° C., containing epoxy groups, a main monomer; ethyl acrylate (EA)/acrylonitrile (AN)) and 8 parts by mass of a latent curing agent (HX3748, manufactured by Asahi Kasei Chemicals Corporation), that (ii) 500 parts by mass of the flat magnetic powder (JEM-S, manufactured by Mitsubishi Materials Corporation) used as the magnetic powder was replaced with 800 parts by mass of a flat magnetic powder (Fe—Si—Al, EMS-10, manufactured by Mitsubishi Materials Corporation), that (iii) 109.1 parts by mass of the silicon atom-containing melamine cyanurate used as the fire retardant was replaced with 115 parts by mass of carboxylic acid amide-containing melamine cyanurate (melamine cyanurate whose surface treated with lauric acid used as the fatty acid, MG-5F, manufactured by SAKAI CHEMICAL INDUSTRY, CO., LTD., a number average particle size of 0.5 μm), and that (iv) the amount of the red phosphorus used as the fire retardant was changed from 6.8 parts by mass to 11.5 parts by mass.

Example 30

A magnetic sheet was produced in the same manner as in Example 29, except that 92 parts by mass of the acrylic rubber A used as the binder in Example 29 was replaced with 72 parts by mass of the acrylic rubber A and 20 parts by mass of an acrylic rubber B (SG790, manufactured by Nagase ChemteX Corporation, a molecular mass of 400,000 to 600,000, Tg of −32° C., containing hydroxyl groups, a main monomer; butyl acrylate (BA)/acrylonitrile (AN).

Example 31

A magnetic sheet was produced in the same manner as in Example 30, except that the amount of the acrylic rubber A used as the binder was changed from 72 parts by mass to 69 parts by mass, that the amount of the acrylic rubber B used as the binder was changed from 20 parts by mass of to 23 parts by mass, and that 800 parts by mass of the flat magnetic powder (Fe–Si–Al, EMS-10, manufactured by Mitsubishi Materials Corporation) used as the magnetic powder was replaced with 1,300 parts by mass of a flat magnetic powder (JEM-S, manufactured by Mitsubishi Materials Corporation).

Example 32

A magnetic sheet was produced in the same manner as in Example 31, except that the amount of the flat magnetic powder used as the magnetic powder was changed from 1,300 parts by mass to 1,550 parts by mass.

Example 33

A magnetic sheet was produced in the same manner as in Example 8, except that the amount of the flat magnetic powder used as the magnetic powder was changed from 500 parts by mass to 1,020 parts by mass, that the amount of the carboxylic acid amide-containing melamine cyanurate used as the fire retardant was changed from 109.1 parts by mass to 79.6 parts by mass, and that the amount of the red phosphorus used as the fire retardant was changed from 9.1 parts by mass to 8.8 parts by mass.

The magnetic sheets produced in Examples 1 to 33 and Comparative Examples 1 to 24 were evaluated by the following methods, with regard to the evaluation of the fire retardance by the flammability test, measurement of magnetic permeability, reliability test in a high temperature and high humidity environment (measurement of thickness variation and inductance variation), presence or absence of powder falling off from a surface of a magnetic sheet surface before and after the reliability test, and measurement of tensile strength by a tensile test. Additionally, the magnetic sheets in Examples 29 to 32 were evaluated with regard to LOSS properties, and the magnetic sheets in Examples 29 to 33 were evaluated with regard to surface glossiness. The results are shown in Tables 1 to 10.

[Flammability Test]

As the flammability test, UL94V test (test for flammability of a plastic materials for parts of devices) was performed. The UL94V test is a method for evaluating fire retardance from the afterflame time after burner flame is applied to a sample for 10 seconds, wherein the sample having a predetermined size is held in a vertical position. The evaluation results are classified into the following criteria.

—Evaluation Criteria—

V-0: The afterflame time of each sample was 10 seconds or less, and total afterflame time of 5 samples was 50 seconds or less.

V-1: The afterflame time of each sample was 30 seconds or less, and total afterflame time of 5 samples was 250 seconds or less.

V-2: Although the combustion time was the same as that of V-1, a flammable drop was present.

NG: Fire retardance was poor, and did not comply with the standard of UL94V.

Here, "after flame time" means a length of time showing how long flame combustion of a test sample continues, after an ignition source is moved away.

[Magnetic Permeability]

At first, the magnetic sheet was cut into a ring shape having an outer diameter of 7.05 mm and inner diameter of 2.945 mm so as to prepare a ring shaped sample, and a conducting wire was winded around the ring shaped sample at 5 turns and was soldered to a terminal. Here, the length between the edge of the terminal and the ring shaped sample was 20 mm. Then, inductance and resistance were measured at a carrier frequency (13.56 MHz) by means of an impedance analyzer (4294A, manufactured by Agilent Technologies, Inc.), and the obtained values were converted into magnetic permeability.

With respect to each of Examples 21 to 33 and Comparative Examples 13 to 24, inductance and resistance were measured at 1 MHz, and the obtained value was converted into magnetic permeability.

$\mu'$ and $\mu''$ respectively denote a real part and an imaginary part, of the complex magnetic permeability.

The characteristics of $\mu'$ and $\mu''$ are different depending on the intended use of the magnetic sheet. For example, in the case where the magnetic sheet is used for improving the transmission of the RFID device, a high value of $\mu'$ and a low value of $\mu''$ are preferable at the frequency of 20 MHz or less.

The magnetic sheet of the present invention can be used in the KHz to GHz range.

[Reliability Test]

—Thickness Variation—

At first, the thickness of the magnetic sheet was measured. Next, the magnetic sheet was placed in an oven, heated for 96 hours at 85° C. and 60%, and then the thickness of the magnetic sheet taken out from the oven was measured. Then, the thickness variation of the magnetic sheet before and after heating was measured.

—Inductance Variation—

At first, the inductance (L) of a sample, which was produced in the same manner as the magnetic permeability by winding a conducting wire around the ring-shaped sample, and soldering it to a terminal, was measured. Next, this sample was placed in an oven, heated for 96 hours at 85° C. and 60%, and then the inductance of the sample taken out from the oven was measured. Then, the inductance of the sample before and after heating was measured.

[Powder Falling]

The powder falling was evaluated by observing whether or not the magnetic powder fell off from a surface of the magnetic sheet and adhered to a hand, when a surface of the magnetic sheet was touched before and after the reliability test described above.

[Tensile Test]

The tensile strengths of 10 samples were measured in accordance with JIS K6251. Note that each of the values of the tensile test in Tables represents an average value of 10 samples.

[Surface Glossiness]

The surface glossiness was measured in accordance with JIS Z8741 or JIS P8142.

[Method of Measuring LOSS Properties (Transmission Loss)]

Figure 5:
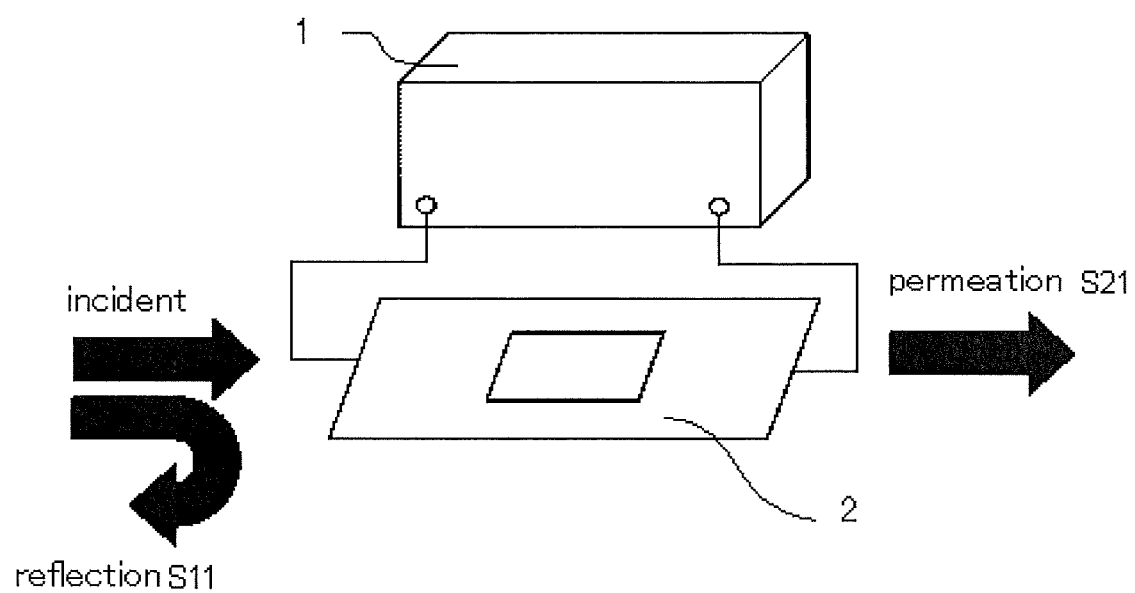
FIG. 5 is a diagram for explaining a measurement method of transmission loss.

For measurement of transmission loss, a microstripline 2 having an impedance Z of 50Ω was used. The use of the microstripline line was a commonly used method for measuring transmission loss of adjacent noise, because of its structure suitable for mounting a surface-mounting component and production easiness. The shape of the microstripline used is shown in FIG. 5. The transmission loss was measured in such a manner that a linear conductor path was provided on a surface of an insulator substrate, and a magnetic sheet was placed on the conductor path for measurement. Both ends of the conductor path were connected to a network analyzer 1. Then, a reflection amount (dB) and a permeation amount (dB) from a part where an electromagnetic wave absorption material was mounted, was measured with respect to incident wave shown by an arrow, and the difference between the reflection amount (dB) and the permeation amount (dB) was obtained as a loss amount, and thus a transmission loss (absorptance) was obtained (incident amount=reflection S11+loss+permeation S21). Specifically, a known amount of an electromagnetic wave was incident, the reflection amount S11 and the permeation amount S21 were measured, and then calculated to obtain a loss amount.

The thicker the magnetic sheet was, the higher the transmission loss of the microstripline became. Generally, a magnetic sheet having a thin thickness and high transmission loss is desired.

TABLE 1

|  |  | Example | | | | |
|---|---|---|---|---|---|---|
|  |  | 1 | 2 | 3 | 4 | 5 |
| Magnetic powder (parts by mass) | Flat magnetic powder (JEM-S) | 500 | 500 | 500 | 500 | 523 |
| Binder (parts by mass) | Acrylic rubber | 73.5 | 73.5 | 73.5 | 73.5 | 73.5 |
|  | Epoxy resin | 20.4 | 20.4 | 20.4 | 20.4 | 20.4 |
|  | Latent curing agent | 6.1 | 6.1 | 6.1 | 6.1 | 6.1 |
| Fire retardant (parts by mass) | Silicon atom-containing melamine cyanurate | 109.1 | 90.9 | 90.9 | 109.1 | 109.1 |
|  | Carboxylic acid amide-containing melamine cyanurate | — | — | — | — | — |
|  | Red phosphorus | 6.8 | 9.1 | 13.6 | 13.6 | 13.6 |

TABLE 1-continued

|  |  | Example | | | | |
|---|---|---|---|---|---|---|
|  |  | 1 | 2 | 3 | 4 | 5 |
| Flammability test | Fire retardance evaluation | V-0 | V-0 | V-0 | V-0 | V-0 |
| Magnetic Permeability | Initial magnetic permeability μ' (13.56 MHz) | 23.5 | 26.1 | 26.8 | 23.1 | 24.0 |
|  | Initial magnetic permeability μ" (13.56 MHz) | 0.10 | 0.28 | 0.24 | 0.22 | 0.16 |
| Reliability test | Thickness before test (μm) | 323 | 332 | 342 | 358 | 343 |
|  | Thickness after test (μm) | 325 | 332 | 344 | 359 | 348 |
|  | Thickness variation (%) | 0.6 | 0.0 | 0.6 | 0.3 | 1.5 |
|  | Inductance (L) variation (%) | 0.0 | −0.4 | −1.3 | −1.4 | −1.0 |
| Powder falling before reliability test |  | absence | absence | absence | absence | absence |
| Powder falling after reliability test |  | absence | absence | absence | absence | absence |
| Tensile test | Tensile strength (MPa) | 32.2 | 30.3 | 28.8 | 27.5 | 27.3 |

TABLE 2

|  |  | Example | | | | |
|---|---|---|---|---|---|---|
|  |  | 6 | 7 | 8 | 9 | 10 |
| Magnetic powder (parts by mass) | Flat magnetic powder (JEM-S) | 500 | 387 | 500 | — | 500 |
|  | Flat magnetic powder (EMS-10) | — | — | — | 500 | — |
| Binder (parts by mass) | Acrylic rubber | 73.5 | 73.5 | 73.5 | 73.5 | 73.5 |
|  | Epoxy resin | 20.4 | 20.4 | 20.4 | 20.4 | 20.4 |
|  | Latent curing agent | 6.1 | 6.1 | 6.1 | 6.1 | 6.1 |
| Fire retardant (parts by mass) | Silicon atom-containing melamine cyanurate | 136.4 | 109.1 | — | — | 109.1 |
|  | Carboxylic acid amide-containing melamine cyanurate | — | — | 109.1 | 109.1 | — |
|  | Red phosphorus | 13.6 | 13.6 | 9.1 | 13.6 | 18.2 |
| Flammability test | Fire retardance evaluation | V-0 | V-0 | V-0 | V-0 | V-0 |
| Magnetic Permeability | Initial magnetic permeability μ' (13.56 MHz) | 20.9 | 19.1 | 21.1 | 46.4 | 22.3 |
|  | Initial magnetic permeability μ" (13.56 MHz) | 0.13 | 0.06 | 0.13 | 10.86 | 0.17 |
| Reliability test | Thickness before test (μm) | 356 | 316 | 334 | 282 | 327 |
|  | Thickness after test (μm) | 358 | 322 | 336 | 289 | 330 |
|  | Thickness variation (%) | 0.6 | 1.9 | 0.6 | 2.4 | 0.9 |
|  | Inductance (L) variation (%) | −1.2 | −0.8 | −1.0 | −0.6 | −1.8 |
| Powder falling before reliability test |  | absence | absence | absence | absence | absence |
| Powder falling after reliability test |  | absence | absence | absence | absence | absence |
| Tensile test | Tensile strength (MPa) | 20.1 | 27.8 | 31.6 | 29.7 | 28.8 |

TABLE 3

|  |  | Example | | | | |
|---|---|---|---|---|---|---|
|  |  | 11 | 12 | 13 | 14 | 15 |
| Magnetic powder (parts by mass) | Flat magnetic powder (JEM-S) | 500 | — | 500 | 500 | 500 |
|  | Flat magnetic powder (JEM-G2) | — | 500 | — | — | — |
| Binder (parts | Acrylic rubber | 73.5 | 73.5 | 73.5 | 73.5 | 73.5 |

TABLE 3-continued

|  |  | Example |  |  |  |  |
|---|---|---|---|---|---|---|
|  |  | 11 | 12 | 13 | 14 | 15 |
| by mass) | Epoxy resin | 20.4 | 20.4 | 20.4 | 20.4 | 20.4 |
|  | Latent curing agent | 6.1 | 6.1 | 6.1 | 6.1 | 6.1 |
| Fire retardant (parts by mass) | Silicon atom-containing melamine cyanurate | 100 | 81.8 | 27.3 | 9.1 | 109.1 |
|  | Carboxylic acid amide-containing melamine cyanurate | — | 9.1 | 63.6 | 81.8 | — |
|  | Red phosphorus | 18.2 | 13.6 | 13.6 | 13.6 | 6.5 |
| Flammability test | Fire retardance evaluation | V-0 | V-0 | V-0 | V-0 | V-1 |
| Magnetic Permeability | Initial magnetic permeability $\mu'$ (13.56 MHz) | 23.3 | 27.1 | 24.8 | 24.9 | 24.8 |
|  | Initial magnetic permeability $\mu''$ (13.56 MHz) | 0.21 | 0.25 | 0.23 | 0.24 | 0.19 |
| Reliability test | Thickness before test ($\mu$m) | 346 | 315 | 310 | 331 | 321 |
|  | Thickness after test ($\mu$m) | 351 | 318 | 310 | 332 | 322 |
|  | Thickness variation (%) | 1.4 | 1.0 | 0.0 | 0.3 | 0.3 |
|  | Inductance (L) variation (%) | −0.7 | −1.1 | −1.2 | −1.6 | −0.2 |
| Powder falling before reliability test |  | absence | absence | absence | absence | absence |
| Powder falling after reliability test |  | absence | absence | absence | absence | absence |
| Tensile test | Tensile strength (MPa) | 28.2 | 33.1 | 31.1 | 32.4 | 29.8 |

TABLE 4

|  |  | Example |  |  |  |  |
|---|---|---|---|---|---|---|
|  |  | 16 | 17 | 18 | 19 | 20 |
| Magnetic powder (parts by mass) | Flat magnetic powder (JEM-S) | 500 | 500 | 500 | 500 | 500 |
| Binder (parts by mass) | Acrylic rubber | 73.5 | 73.5 | 73.5 | 73.5 | 73.5 |
|  | Epoxy resin | 20.4 | 20.4 | 20.4 | 20.4 | 20.4 |
|  | Latent curing agent | 6.1 | 6.1 | 6.1 | 6.1 | 6.1 |
| Fire retardant (parts by mass) | Silicon atom-containing melamine cyanurate | 127.3 | 90.9 | 100 | 89 | 111 |
|  | Carboxylic acid amide-containing melamine cyanurate | — | — | — | — | — |
|  | Red phosphorus | 5.9 | 6.8 | 19.1 | 6.8 | 6.8 |
| Flammability test | Fire retardance evaluation | V-1 | V-0 | V-0 | V-1 | V-0 |
| Magnetic Permeability | Initial magnetic permeability $\mu'$ (13.56 MHz) | 23.3 | 25.5 | 19.2 | 26.2 | 22.1 |
|  | Initial magnetic permeability $\mu''$ (13.56 MHz) | 0.15 | 0.20 | 0.16 | 0.28 | 0.21 |
| Reliability test | Thickness before test ($\mu$m) | 337 | 329 | 335 | 362 | 334 |
|  | Thickness after test ($\mu$m) | 342 | 331 | 336 | 364 | 336 |
|  | Thickness variation (%) | 1.5 | 0.6 | 0.3 | 0.6 | 0.6 |
|  | Inductance (L) variation (%) | −0.3 | 0.0 | −1.7 | −1.3 | −1.5 |
| Powder falling before reliability test |  | absence | absence | absence | absence | absence |
| Powder falling after reliability test |  | absence | absence | absence | absence | absence |
| Tensile test | Tensile strength (MPa) | 28.4 | 34.2 | 33.7 | 35.1 | 31.7 |

TABLE 5

| | | Comparative Example | | | | | |
|---|---|---|---|---|---|---|---|
| | | 1 | 2 | 3 | 4 | 5 | 6 |
| Magnetic powder (parts by mass) | Flat magnetic powder (JEM-S) | 500 | 500 | 500 | 500 | 500 | 500 |
| Binder (parts by mass) | Acrylic rubber | 73.5 | 73.5 | 73.5 | 73.5 | 73.5 | 73.5 |
| | Epoxy resin | 20.4 | 20.4 | 20.4 | 20.4 | 20.4 | 20.4 |
| | Latent curing agent | 6.1 | 6.1 | 6.1 | 6.1 | 6.1 | 6.1 |
| Fire retardant (parts by mass) | Silicon atom-containing melamine cyanurate | — | — | — | — | — | — |
| | Carboxylic acid amide-containing melamine cyanurate | — | — | — | — | — | — |
| | Red phosphorus | 13.6 | 13.6 | 13.6 | 13.6 | 13.6 | 13.6 |
| | Melamine cyanurate (MC4000, no surface treatment) | 109.1 | — | — | — | — | — |
| | Melamine cyanurate (MC6000, no surface treatment) | — | 109.1 | — | — | — | — |
| | Melamine polyphosphate (PMP100) | — | — | 109.1 | — | — | — |
| | Melamine polyphosphate (PMP200) | — | — | — | 109.1 | — | — |
| | Magnesium hydroxide (MGZ-3) | — | — | — | — | 109.1 | — |
| | Ammonium polyphosphate (AP462) | — | — | — | — | — | 109.1 |
| Flammability test | Fire retardance evaluation | V-0 | V-0 | V-0 | V-0 | NG | NG |
| Magnetic Permeability | Initial magnetic permeability μ' (13.56 MHz) | 20.0 | 23.6 | 15.3 | 13.8 | 21.6 | 16.3 |
| | Initial magnetic permeability μ" (13.56 MHz) | 0.15 | 0.25 | 0.02 | 0.01 | 0.01 | 0.00 |
| Reliability test | Thickness before test (μm) | 362 | 363 | 492 | 516 | 497 | 500 |
| | Thickness after test (μm) | 389 | 399 | 552 | 562 | 530 | 543 |
| | Thickness variation (%) | 7.5 | 9.9 | 12.2 | 13.8 | 6.64 | 8.60 |
| | Inductance (L) variation (%) | −2.6 | −1.7 | −0.7 | −6.0 | −2.7 | −15.2 |
| Powder falling before reliability test | | presence | presence | presence | presence | presence | presence |
| Powder falling after reliability test | | presence | presence | presence | presence | presence | presence |
| Tensile test | Tensile strength (MPa) | 24.3 | 22.8 | 23.2 | 24.1 | 22.2 | 21.3 |

TABLE 6

| | | Comparative Example | | | | | |
|---|---|---|---|---|---|---|---|
| | | 7 | 8 | 9 | 10 | 11 | 12 |
| Magnetic powder (parts by mass) | Flat magnetic powder (JEM-S) | 500 | 500 | 500 | — | — | — |
| | Flat magnetic powder (EMS-10) | — | — | — | 500 | 500 | 500 |
| Binder (parts by mass) | Acrylic rubber | 73.5 | 73.5 | 73.5 | 73.5 | 73.5 | 73.5 |
| | Epoxy resin | 20.4 | 20.4 | 20.4 | 20.4 | 20.4 | 20.4 |
| | Latent curing agent | 6.1 | 6.1 | 6.1 | 6.1 | 6.1 | 6.1 |
| Fire retardant (parts by mass) | Silicon atom-containing melamine cyanurate | — | — | — | — | — | — |
| | Carboxylic acid amide-containing melamine cyanurate | — | — | — | — | — | — |
| | Red phosphorus | 13.6 | 13.6 | 13.6 | 13.6 | 13.6 | 13.6 |
| | Melamine cyanurate (MC4000, no surface treatment) | — | — | — | 109.1 | — | — |
| | Melamine polyphosphate (PMP100) | — | — | — | — | 109.1 | — |
| | Melamine polyphosphate (PMP200) | — | — | — | — | — | 109.1 |

TABLE 6-continued

|  |  | Comparative Example | | | | | |
|---|---|---|---|---|---|---|---|
|  |  | 7 | 8 | 9 | 10 | 11 | 12 |
|  | Ammonium polyphosphate (FCP-770) | 109.1 | — | — | — | — | — |
|  | Ammonium polyphosphate (TERRAJU C-80) | — | 109.1 | — | — | — | — |
|  | Ammonium polyphosphate (FRCROSS486) | — | — | 109.1 | — | — | — |
| Flammability test | Fire retardance evaluation | NG | NG | NG | V-0 | V-0 | V-0 |
| Magnetic Permeability | Initial magnetic permeability μ' (13.56 MHz) | 16.9 | 17.5 | 16.5 | 38.6 | 24.4 | 21.6 |
|  | Initial magnetic permeability μ" (13.56 MHz) | 0.01 | 0.02 | 0.01 | 8.83 | 3.87 | 3.30 |
| Reliability test | Thickness before test (μm) | 491 | 495 | 498 | 332 | 479 | 538 |
|  | Thickness after test (μm) | 526 | 510 | 554 | 348 | 561 | 596 |
|  | Thickness variation (%) | 7.13 | 3.03 | 11.24 | 4.8 | 17.1 | 10.8 |
|  | Inductance (L) variation (%) | −3.5 | −1.3 | −6.3 | −2.1 | −5.6 | −5.7 |
| Powder falling before reliability test |  | Pres | Pres | Pres | Pres | Pres | Pres |
| Powder falling after reliability test |  | Pres | Pres | Pres | Pres | Pres | Pres |
| Tensile test | Tensile strength (MPa) | 24.3 | 18.2 | 19.3 | 25.4 | 23.6 | 22.9 |

Pres denotes presence.

TABLE 7

|  |  | Example | | | | | | | |
|---|---|---|---|---|---|---|---|---|---|
|  |  | 21 | 22 | 23 | 24 | 25 | 26 | 27 | 28 |
| Magnetic powder (parts by mass) | Flat magnetic powder (Fe—Si—Al; EMS-10) | 600 | 600 | 600 | 600 | 600 | 600 | 600 | 630 |
| Binder (parts by mass) | Ethylene-vinyl acetate copolymer (LEVAPREN 800HV) | 100 | 100 | 100 | 100 | — | — | — | 100 |
|  | Ethylene-vinyl acetate copolymer (LEVAPREN 600HV) | — | — | — | — | — | 100 | — | — |
|  | Ethylene-vinyl acetate copolymer (LEVAPREN 900HV) | — | — | — | — | — | — | 100 | — |
|  | Ethylene-vinyl acetate copolymer (EV45LX) | — | — | — | — | 100 | — | — | — |
| Fire retardant (parts by mass) | Silicon atom-containing melamine cyanurate | — | — | — | — | — | — | — | — |
|  | Carboxylic acid amide-containing melamine cyanurate | 80 | 75 | 85 | 70 | 85 | 90 | 80 | 100 |
|  | Red phosphorus | 10 | 10 | 10 | 15 | 10 | 10 | 10 | 10 |
|  | Melamine cyanurate (MC4000, no surface treatment) | — | — | — | — | — | — | — | — |
|  | Melamine polyphosphate (PMP100) | — | — | — | — | — | — | — | — |
|  | Melamine polyphosphate (PMP200) | — | — | — | — | — | — | — | — |
|  | Ammonium polyphosphate (FCP-770) | — | — | — | — | — | — | — | — |
|  | Ammonium polyphosphate (TERRAJU C-80) | — | — | — | — | — | — | — | — |
|  | Ammonium polyphosphate (FRCROSS486) | — | — | — | — | — | — | — | — |
|  | Aluminum hydroxide (AOH60) | — | — | 5 | — | — | — | — | — |
|  | Magnesium hydroxide (MGZ-3) | — | — | — | — | — | — | — | — |
| Flammability test | Fire retardance evaluation | V-0 | V-0 | V-0 | V-0 | V-0 | V-0 | V-0 | V-0 |
| Magnetic Permeability | Initial magnetic permeability μ' (13.56 MHz) | 66.8 | 68.4 | 60.8 | 58.3 | 66.8 | 65.1 | 68.1 | 65.2 |
|  | Initial magnetic permeability μ" (13.56 MHz) | 17.3 | 18.1 | 15.6 | 14.8 | 17.2 | 16.1 | 17.2 | 16.8 |
|  | Initial magnetic permeability μ' (1 MHz) | 81.2 | 83.6 | 71.4 | 69.2 | 77.1 | 76.2 | 79.2 | 77.2 |

TABLE 7-continued

|  |  | Example | | | | | | | |
|---|---|---|---|---|---|---|---|---|---|
|  |  | 21 | 22 | 23 | 24 | 25 | 26 | 27 | 28 |
| Reliability test | Thickness before test (μm) | 123 | 143 | 113 | 118 | 126 | 118 | 121 | 113 |
|  | Thickness after test (μm) | 153 | 180 | 152 | 158 | 166 | 160 | 168 | 160 |
|  | Thickness variation (%) | 24.39 | 25.87 | 34.51 | 33.90 | 31.75 | 35.59 | 38.84 | 41.59 |
|  | Inductance(L) variation(%) | −4.8 | −4.7 | −5.9 | −5.7 | −5.6 | −6.2 | −6.6 | −7.1 |
| Powder falling before reliability test | | Ab | Ab | Ab | Ab | Ab | Ab | Ab | Ab |
| Powder falling after reliability test | | Ab | Ab | Ab | Ab | Ab | Ab | Ab | Ab |
| Tensile test | Tensile strength (MPa) | 6.8 | 6.6 | 6.9 | 6.1 | 5.9 | 6.3 | 7.0 | 7.3 |

Ab denotes absence.

TABLE 8

|  |  | Comparative Example | | | | | |
|---|---|---|---|---|---|---|---|
|  |  | 13 | 14 | 15 | 16 | 17 | 18 |
| Magnetic powder (parts by mass) | Flat magnetic powder (Fe—Si—Al; EMS-10) | 550 | 550 | 550 | 600 | 600 | 600 |
| Binder (parts by mass) | Ethylene-vinyl acetate copolymer (LEVAPREN 800HV) | 100 | 100 | 100 | 100 | 100 | 100 |
|  | Ethylene-vinyl acetate copolymer (LEVAPREN 600HV) | — | — | — | — | — | — |
|  | Ethylene-vinyl acetate copolymer (LEVAPREN 900HV) | — | — | — | — | — | — |
|  | Ethylene-vinyl acetate copolymer (EV45LX) | — | — | — | — | — | — |
| Fire retardant (parts by mass) | Silicon atom-containing melamine cyanurate | — | — | — | — | — | — |
|  | Carboxylic acid amide-containing melamine cyanurate | — | — | — | — | — | — |
|  | Red phosphorus | 10 | 10 | 10 | 10 | 10 | 10 |
|  | Melamine cyanurate (MC4000, no surface treatment) | — | — | — | — | 80 | — |
|  | Melamine polyphosphate (PMP100) | — | — | — | — | — | 80 |
|  | Melamine polyphosphate (PMP200) | — | — | — | — | — | — |
|  | Ammonium polyphosphate (FCP-770) | 80 | — | — | — | — | — |
|  | Ammonium polyphosphate (TERRAJU C-80) | — | — | — | — | — | — |
|  | Ammonium polyphosphate (FRCROSS486) | — | — | — | — | — | — |
|  | Aluminum hydroxide (AOH60) | — | 80 | — | 10 | — | — |
|  | Magnesium hydroxide (MGZ-3) | — | — | 80 | 80 | — | — |
| Flammability test | Fire retardance evaluation | NG | NG | NG | NG | NG | NG |
| Magnetic Permeability | Initial magnetic permeability μ' (13.56 MHz) | 29.8 | 31.2 | 41.8 | 28.8 | 28.1 | 30.9 |
|  | Initial magnetic permeability μ" (13.56 MHz) | 5.1 | 5.6 | 7.8 | 5.2 | 5.1 | 5.3 |
|  | Initial magnetic permeability μ' (1 MHz) | 38.9 | 42.7 | 49.8 | 38.2 | 37.3 | 42.1 |
| Reliability test | Thickness before test (μm) | 134 | 124 | 108 | 116 | 134 | 122 |
|  | Thickness after test (μm) | 183 | 172 | 146 | 159 | 182 | 167 |
|  | Thickness variation (%) | 36.57 | 38.71 | 35.19 | 37.07 | 35.82 | 36.89 |
|  | Inductance (L) variation (%) | −7.7 | −7.2 | −7.9 | −8.2 | −7.7 | −9.1 |
| Powder falling before reliability test | | Pres | Pres | Pres | Pres | Pres | Pres |
| Powder falling after reliability test | | Pres | Pres | Pres | Pres | Pres | Pres |
| Tensile test | Tensile strength (MPa) | 4.6 | 4.7 | 5.1 | 4.4 | 5.3 | 5.4 |

Pres denotes presence.

TABLE 9

| | | Comparative Example | | | | | |
|---|---|---|---|---|---|---|---|
| | | 19 | 20 | 21 | 22 | 23 | 24 |
| Magnetic powder (parts by mass) | Flat magnetic powder (Fe—Si—Al; EMS-10) | 600 | 600 | 600 | 600 | 600 | 600 |
| Binder (parts by mass) | Ethylene-vinyl acetate copolymer (LEVAPREN 800HV) | 100 | 100 | 100 | 100 | 100 | 100 |
| | Ethylene-vinyl acetate copolymer (LEVAPREN 600HV) | — | — | — | — | — | — |
| | Ethylene-vinyl acetate copolymer (LEVAPREN 900HV) | — | — | — | — | — | — |
| | Ethylene-vinyl acetate copolymer (EV45LX) | — | — | — | — | — | — |
| Fire retardant (parts by mass) | Silicon atom-containing melamine cyanurate | — | — | — | — | — | — |
| | Carboxylic acid amide-containing melamine cyanurate | — | — | — | — | — | — |
| | Red phosphorus | 10 | 10 | 10 | 10 | 10 | 10 |
| | Melamine cyanurate (MC4000, no surface treatment) | — | — | — | — | — | — |
| | Melamine polyphosphate (PMP100) | — | — | — | — | — | — |
| | Melamine polyphosphate (PMP200) | 80 | — | — | — | — | — |
| | Ammonium polyphosphate (FCP-770) | — | 80 | — | — | — | — |
| | Ammonium polyphosphate (TERRAJU C-80) | — | — | 80 | — | — | — |
| | Ammonium polyphosphate (FRCROSS486) | — | — | — | 80 | — | — |
| | Aluminum hydroxide (AOH60) | — | — | — | — | 80 | — |
| | Magnesium hydroxide (MGZ-3) | — | — | — | — | — | 80 |
| Flammability test | Fire retardance evaluation | NG | NG | NG | NG | NG | NG |
| Magnetic Permeability | Initial magnetic permeability μ' (13.56 MHz) | 27.8 | 28.6 | 30.0 | 32.3 | 33.7 | 32.1 |
| | Initial magnetic permeability μ'' (13.56 MHz) | 4.6 | 4.7 | 4.9 | 5.3 | 5.6 | 5.1 |
| | Initial magnetic permeability μ' (1 MHz) | 36.6 | 38.4 | 41.6 | 43.6 | 44.8 | 42.6 |
| Reliability test | Thickness before test (μm) | 131 | 137 | 141 | 132 | 145 | 143 |
| | Thickness after test (μm) | 182 | 189 | 193 | 189 | 203 | 195 |
| | Thickness variation (%) | 38.93 | 37.96 | 36.88 | 43.18 | 40.00 | 36.36 |
| | Inductance (L) variation (%) | −9.3 | −8.8 | −6.9 | −7.6 | −8.2 | −9.1 |
| Powder falling before reliability test | | Pres | Pres | Pres | Pres | Pres | Pres |
| Powder falling after reliability test | | Pres | Pres | Pres | Pres | Pres | Pres |
| Tensile test | Tensile strength (MPa) | 5.1 | 4.4 | 4.9 | 5.6 | 5.2 | 5.7 |

Pres denotes presence.

TABLE 10

| | | Example | | | | |
|---|---|---|---|---|---|---|
| | | 29 | 30 | 31 | 32 | 33 |
| Magnetic powder (parts by mass) | Flat magnetic powder (JEM-S) | — | — | 1,300 | 1,550 | 1,020 |
| | Flat magnetic powder (EMS-10) | 800 | 800 | — | — | — |
| Binder (parts by mass) | Acrylic rubber (SG80H-3) | — | — | — | — | 73.5 |
| | Acrylic rubber A (SG series) | 92 | 72 | 69 | 69 | — |
| | Acrylic rubber B (SG790) | — | 20 | 23 | 23 | — |
| | Epoxy resin (EPICOAT 1031S) | — | — | — | — | 20.4 |
| | Latent curing agent | 8 | 8 | 8 | 8 | 6.1 |
| Fire retardant (parts by mass) | Silicon atom-containing melamine cyanurate | — | — | — | — | — |
| | Carboxylic acid amide-containing melamine cyanurate | 115 | 115 | 115 | 115 | 79.6 |

TABLE 10-continued

| | | Example | | | | |
|---|---|---|---|---|---|---|
| | | 29 | 30 | 31 | 32 | 33 |
| Flammability test | Red phosphorus | 11.5 | 11.5 | 11.5 | 11.5 | 8.8 |
| | Fire retardance evaluation | V-0 | V-0 | V-0 | V-0 | V-0 |
| Magnetic Permeability | Initial magnetic permeability $\mu'$ (1 MHz) | 75.4 | 97.2 | 44.8 | 43.2 | 42.1 |
| | Initial magnetic permeability $\mu'$ (13.56 MHz) | 66.8 | 83.2 | 45.1 | 43.4 | 43.4 |
| | Initial magnetic permeability $\mu''$ (13.56 MHz) | 19.6 | 24.8 | 0.56 | 0.83 | 1.45 |
| Reliability test | Thickness before test (μm) | 100 | 105 | 113 | 133 | 248 |
| | Thickness after test (μm) | 102 | 106 | 116 | 137 | 251 |
| | Thickness variation (%) | 2.00 | 0.95 | 2.65 | 3.01 | 1.20 |
| | Inductance (L) variation (%) | −1.20 | −0.80 | −1.40 | −1.90 | −0.80 |
| Powder falling before reliability test | | absence | absence | absence | absence | absence |
| Powder falling after reliability test | | absence | absence | absence | absence | absence |
| Tensile test | Tensile strength (MPa) | 12.4 | 12.4 | 16.8 | 13.2 | 21.2 |
| Surface glossiness (%) | | 23.4 | 33.4 | 23.1 | 18.7 | 28.3 |
| LOSS properties | 100 MHz (%) | 3.01 | 4.68 | 2.67 | 2.39 | — |
| | 500 MHz (%) | 14.97 | 34.05 | 23.94 | 25.46 | — |
| | 1 GHz (%) | 38.09 | 62.69 | 60.00 | 65.21 | — |

As can be seen from the results of Tables 1 to 10, the magnetic sheets of Examples 1 to 33, each of which contained at least one of the silicon atom-containing melamine cyanurate and the carboxylic acid amide-containing melamine cyanurate, had high fire retardance, and caused no powder falling from a surface of the magnetic sheet both before and after the reliability test in a high temperature and high humidity environment. It was found that the magnetic sheets of Examples 1 to 33 had high initial magnetic permeability at 13.56 MHz, and could be suitably used in RFID functioned mobile phones. Moreover, it was found that the magnetic sheets of Examples 1 to 20, each of which further included the latent curing agent, were excellent in dimensional stability in a high temperature and high humidity environment. It was found that the magnetic sheets of Examples 21 to 28, each of which did not contain the latent curing agent, but contained ethylene vinyl acetate used as the binder and the carboxylic acid amide-containing melamine cyanurate used as the fire retardant, could have flexibility. From the results of evaluation of LOSS properties, it was found that the magnetic sheets of Examples 29 to 32 had high radio wave absorption.

On the other hand, each of the magnetic sheets of Comparative Examples 1 to 24, powder falling from the surface of the magnetic sheet occurred both before and after the reliability test. Each of the magnetic sheets of Comparative Examples 5 to 9, and 13 to 24 had extremely low fire retardance, the magnetic sheets of Comparative Examples 1, 2 and 10 each of which contained melamine cyanurate whose surface was not treated, as the fire retardant, and the magnetic sheets of Comparative Examples 3, 4, 11 and 12 each of which contained melamine polyphosphate had excellent fire retardance, but had large thickness variation in a high temperature and high humidity environment, and had poor dimensional stability and large degradation in magnetic properties.

The magnetic sheet of the present invention is suitably used for, for example, an electromagnetic noise depressor, an electromagnetic wave absorber, a magnetic shielding material, an electronic equipment having an IC tag function such as RFID and non-contact IC card, and is particularly suitably used for a RFID functioned mobile phone.

What is claimed is:

1. A magnetic sheet comprising:
a binder;
a magnetic powder; and
a fire retardant,
wherein the binder comprises an epoxy resin,
wherein the fire retardant comprises at least one of a silicon atom-containing melamine cyanurate and a carboxylic acid amide-containing melamine cyanurate,
wherein the magnetic sheet comprises 400 parts by mass to 1,550 parts by mass of the magnetic powder, and 70 parts by mass to 150 parts by mass of at least one of the silicon atom-containing melamine cyanurate and the carboxylic acid amide-containing melamine cyanurate, relative to 100 parts by mass of the binder,
wherein the mass of the magnetic powder in the magnetic sheet is 60% by mass to 90% by mass,
wherein the at least one of the silicon atom-containing melamine cyanurate and the carboxylic acid amide-containing melamine cyanurate has a number average particle size of 1 μm or less,
wherein the fire retardant further comprises red phosphorus, and
wherein the amount of the red phosphorus is 6 parts by mass to 19 parts by mass, relative to 100 parts by mass of the binder.

2. The magnetic sheet according to claim 1, further comprising a curing agent.

3. A method for inhibiting electromagnetic disorders occurred in RFID functional electronic equipment comprising a step of utilizing a magnetic sheet according to claim 1.

4. A method for depression of noise comprising a step of utilizing a magnetic sheet according to claim 1.

5. The magnetic sheet according to claim 1, wherein a surface of the red phosphorus is treated with aluminum hydroxide.

6. The magnetic sheet according to claim 1, wherein the fire retardant comprises the carboxylic acid amide-containing melamine cyanurate.

7. A magnetic sheet comprising:
a binder;
a magnetic powder; and
a fire retardant,
wherein the binder comprises at least one of an epoxy resin and an ethylene-vinyl acetate copolymer,
wherein the fire retardant comprises a carboxylic acid amide-containing melamine cyanurate,
wherein the magnetic sheet comprises 400 parts by mass to 1,550 parts by mass of the magnetic powder, and 70 parts by mass to 150 parts by mass of the carboxylic acid amide-containing melamine cyanurate, relative to 100 parts by mass of the binder,
wherein the mass of the magnetic powder in the magnetic sheet is 60% by mass to 90% by mass,
wherein the carboxylic acid amide-containing melamine cyanurate has a number average particle size of 1 μm or less,
wherein the fire retardant further comprises red phosphorus, and
wherein the amount of the red phosphorus is 6 parts by mass to 19 parts by mass, relative to 100 parts by mass of the binder.

8. The magnetic sheet according to claim 7, further comprising a curing agent.

9. A method for inhibiting electromagnetic disorders occurred in RFID functional electronic equipment comprising a step of utilizing a magnetic sheet according to claim 7.

10. A method for depression of noise comprising a step of utilizing a magnetic sheet according to claim 7.

11. The magnetic sheet according to claim 7, wherein a surface of the red phosphorus is treated with aluminum hydroxide.

* * * * *